US012770942B2

(12) United States Patent
Johnson

(10) Patent No.: US 12,770,942 B2
(45) Date of Patent: Oct. 20, 2026

(54) SYSTEM FOR CHARGING A HOUSE BATTERY BANK FROM AN ALTERNATOR

(71) Applicant: Lithium Charging Concepts, Inc., Lake Stevens, WA (US)

(72) Inventor: Eric Johnson, Lake Stevens, WA (US)

(73) Assignee: Lithium Charging Concepts, Inc., Lake Stevens, WA (US)

( * ) Notice: Subject to any disclaimer, the term of this patent is extended or adjusted under 35 U.S.C. 154(b) by 0 days.

(21) Appl. No.: 19/078,885

(22) Filed: Mar. 13, 2025

(65) Prior Publication Data

US 2026/0031416 A1 Jan. 29, 2026

Related U.S. Application Data

(60) Provisional application No. 63/676,129, filed on Jul. 26, 2024.

(51) Int. Cl.
*H01M 10/44* (2006.01)
*G01R 31/34* (2020.01)
*G01R 31/3835* (2019.01)

(52) U.S. Cl.
CPC ........ *H01M 10/441* (2013.01); *G01R 31/343* (2013.01); *G01R 31/3835* (2019.01); *H01M 2220/20* (2013.01)

(58) Field of Classification Search
CPC ............. G01R 31/343; G01R 31/3835; H01M 10/441; H01M 2220/20

(Continued)

(56) References Cited

U.S. PATENT DOCUMENTS 1,126,184 A * 1/1915 Dawley ..................... H02J 9/08 290/35
1,214,555 A * 2/1917 Leece ................... F02N 19/001 336/147

(Continued)

OTHER PUBLICATIONS

Time Delay Relay: Working Principle, Applications. CHINT Blog. (Aug. 17, 2022). https://www.chintglobal.com/global/en/about-us/news-center/blog/time-delay-relay.html (Year: 2022).*

(Continued)

*Primary Examiner* — Drew A Dunn
*Assistant Examiner* — Frank Alexis Silva
(74) *Attorney, Agent, or Firm* — Christensen O'Connor Johnson Kindness PLLC

(57) ABSTRACT

In some embodiments, a system for charging a house battery bank in a vehicle is provided. The system comprises a disconnect solenoid electrically coupled to a starter battery and an alternator of the vehicle; and a controller monitor. The controller monitor is configured to adjust a disconnect signal to cause the disconnect solenoid to disconnect the starter battery from the alternator in response to detecting an ignition on signal and detecting a merge signal indicating an electrical connection between the house battery bank and at least one of the starter battery or the alternator. In some embodiments, a method of charging a house battery bank is provided that comprises charging at least one house battery bank with an alternator powered by an engine, and contemporaneously charging a starter battery with a direct current (DC) to DC charger powered by the alternator.

26 Claims, 7 Drawing Sheets

(58) Field of Classification Search
USPC .......................................................... 320/134
See application file for complete search history.

(56) References Cited

U.S. PATENT DOCUMENTS 1,230,541 A * 6/1917 Varley .................... F02P 15/12 290/41
1,370,162 A * 3/1921 Springer ............ B60R 16/0235 123/41.65
1,389,716 A * 9/1921 Vleet ....................... H02P 9/00 290/30 R
1,898,370 A * 2/1933 Hughes .................. F02N 11/08 307/10.6
2,131,026 A * 9/1938 Doman .................... H02J 7/22 361/170
2,603,690 A * 7/1952 Moody ................... F01M 1/26 361/170
2,740,904 A * 4/1956 Goss ................... B60H 1/3222 307/64
2,762,933 A * 9/1956 Foxcroft ................ F02N 11/08 290/30 R
2,856,543 A * 10/1958 Dixon ...................... H02J 9/08 123/549
3,006,328 A * 10/1961 Kinoshita .............. F02P 15/12 123/179.5
3,174,048 A * 3/1965 Snyder ..................... H02J 7/02 307/64
3,457,491 A * 7/1969 Cockrell .............. H02J 7/1438 340/654
3,496,920 A * 2/1970 Shano .................... F02P 1/086 310/70 R
3,551,800 A * 12/1970 Widmer .............. G01R 31/006 73/114.62
3,763,415 A * 10/1973 Ownby ................ H02J 7/1423 320/DIG. 34
3,775,640 A * 11/1973 English ................. B60Q 9/001 315/83
3,781,651 A * 12/1973 Heidel ............... H02J 7/00308 361/194
3,893,029 A * 7/1975 Vensel .................. G01R 31/34 324/764.01
3,900,784 A * 8/1975 Seike ................... H02J 7/1423 320/140
3,949,289 A * 4/1976 Day ..................... H02J 7/1423 320/DIG. 34
4,037,684 A * 7/1977 Moyer ................. B66F 11/044 182/19
4,082,992 A * 4/1978 Day ................... F02N 11/0866 320/DIG. 34
4,090,122 A * 5/1978 Hoinski ............... H02J 7/1423 320/125
4,127,782 A * 11/1978 Omura ............... B60R 16/0307 307/66
4,207,511 A * 6/1980 Radtke ................. H02J 7/1423 320/DIG. 11
4,233,552 A * 11/1980 Baumbach .......... F02N 11/0866 320/DIG. 20
4,264,855 A * 4/1981 Ghibaudo ............ H02J 7/1423 320/124
4,316,095 A * 2/1982 Laffoon ................. F02N 11/14 307/10.6
4,321,646 A * 3/1982 Ku ....................... H02J 7/1438 361/187
4,348,628 A * 9/1982 Loucks ................ H02J 7/1423 320/124
4,490,779 A * 12/1984 Minks .................. H02M 7/155 363/128
4,492,912 A * 1/1985 Nowakowski ........ H02J 7/1423 320/155
4,523,491 A * 6/1985 Dittmann, Jr. .......... F16H 3/089 74/333
4,540,929 A * 9/1985 Binkley ................. H02J 7/342 320/112
4,564,797 A * 1/1986 Binkley .................. H02J 7/342 320/105
4,791,349 A * 12/1988 Minks ..................... G05F 1/563 323/273
4,857,820 A * 8/1989 Tompkins ............. H02J 7/0042 320/164
5,081,365 A * 1/1992 Field ...................... B60L 58/20 903/946
5,130,883 A * 7/1992 Edwards ............ H03K 17/0822 307/64
5,162,720 A * 11/1992 Lambert ............... H02J 7/0024 320/138
5,256,956 A * 10/1993 Tsuchiya ................ B32B 27/06 320/128
5,325,038 A * 6/1994 Banzai .................. H02J 7/1438 320/135
5,343,351 A * 8/1994 Quantz .................. H02H 3/207 361/33
5,397,991 A * 3/1995 Rogers .................. H02J 7/0049 324/427
5,418,444 A * 5/1995 Cook .................... H02J 7/1423 320/125
5,448,152 A * 9/1995 Albright ............... H02J 7/1423 320/128
5,455,463 A * 10/1995 Langnickel ............. B60L 58/20 307/66
5,539,388 A * 7/1996 Modgil .................. H04B 3/548 340/3.7
5,602,459 A * 2/1997 Rogers .................. H02J 7/1423 320/160
5,742,137 A * 4/1998 Bratton ................. F02N 11/105 74/6
5,848,577 A * 12/1998 Sappe ................... F02N 11/087 290/38 R
5,896,022 A * 4/1999 Jacobs, Sr. ............ H02J 7/1423 320/103
5,977,652 A * 11/1999 Frey ...................... H02J 7/1423 307/64
5,986,431 A * 11/1999 Hayes ................... H02J 7/1423 320/112
6,057,666 A * 5/2000 Dougherty ............. H02J 7/342 320/162
6,222,341 B1 * 4/2001 Dougherty ............ H02J 7/1423 307/10.1
6,229,279 B1 * 5/2001 Dierker ................. H02J 7/0025 320/126
6,232,674 B1 * 5/2001 Frey .................... H02M 3/1582 307/64
6,271,642 B1 * 8/2001 Dougherty ........... G08B 29/181 320/132
6,304,054 B1 * 10/2001 Granberg ............ F02N 11/0866 307/10.1
6,320,351 B1 * 11/2001 Ng ........................ H02J 7/0032 320/136
6,323,608 B1 * 11/2001 Ozawa .................... B60L 50/16 320/140
6,353,306 B1 * 3/2002 Mixon ...................... H02J 7/14 320/160
6,384,573 B1 * 5/2002 Dunn ...................... F02N 11/10 320/107
6,417,579 B1 * 7/2002 Lehnst ................... B60K 28/14 307/10.6
6,452,361 B2 * 9/2002 Dougherty ............ H02J 7/1423 320/104
6,466,024 B1 * 10/2002 Rogers ............. H02J 7/007192 60/284
6,515,456 B1 * 2/2003 Mixon .............. H02J 7/007194 320/160
6,545,445 B1 * 4/2003 McDermott ........ F02N 11/0866 320/103
6,554,088 B2 * 4/2003 Severinsky .............. B60K 6/22 180/65.23
6,597,149 B1 * 7/2003 Urlass ..................... F02N 11/14 340/455
6,645,017 B1 * 11/2003 Skrzypek ................... B63J 3/02 440/6

(56) References Cited

U.S. PATENT DOCUMENTS

| | | | | | |
|---|---|---|---|---|---|
| 6,646,845 | B1 * | 11/2003 | Turner | H02J 9/002 | 320/148 |
| 6,656,083 | B2 * | 12/2003 | Esaki | B60W 10/08 | 903/917 |
| 6,684,839 | B2 * | 2/2004 | Yang | F02N 11/0866 | 123/179.5 |
| 6,717,291 | B2 * | 4/2004 | Purkey | H01M 50/249 | 307/10.6 |
| 6,727,708 | B1 * | 4/2004 | Dougherty | B60L 58/12 | 320/132 |
| 6,731,021 | B1 * | 5/2004 | Urlass | H02J 7/1438 | 320/126 |
| 6,734,651 | B2 * | 5/2004 | Cook | H02J 7/1423 | 320/103 |
| 6,765,312 | B1 * | 7/2004 | Urlass | H02J 7/1423 | 307/23 |
| 6,815,931 | B1 * | 11/2004 | Wells | H02J 7/1423 | 320/155 |
| 6,833,630 | B2 * | 12/2004 | Kiefer | H02P 9/04 | 290/34 |
| 6,836,094 | B1 * | 12/2004 | Bender | H02J 7/0031 | 320/104 |
| 6,886,647 | B1 * | 5/2005 | Gotta | B60L 15/2009 | 180/65.285 |
| 6,924,621 | B2 * | 8/2005 | Jabaji | H02J 7/0031 | 320/117 |
| 6,967,463 | B1 * | 11/2005 | Gordon | H02J 7/0019 | 320/103 |
| 7,061,246 | B2 * | 6/2006 | Dougherty | G01R 31/36 | 324/426 |
| 7,104,347 | B2 * | 9/2006 | Severinsky | B60L 50/61 | 180/65.23 |
| 7,145,259 | B2 * | 12/2006 | Spellman | F02N 15/06 | 290/48 |
| 7,150,159 | B1 * | 12/2006 | Brummett | B60H 1/3226 | 62/239 |
| 7,157,884 | B2 * | 1/2007 | Hacsi | H02H 9/001 | 320/167 |
| 7,205,746 | B2 * | 4/2007 | Batson | H02J 7/005 | 324/429 |
| 7,218,118 | B1 * | 5/2007 | Gonring | G01R 31/3647 | 320/132 |
| 7,237,634 | B2 * | 7/2007 | Severinsky | B60L 50/16 | 180/65.265 |
| 7,243,630 | B2 * | 7/2007 | Boe | B60W 10/06 | 290/38 E |
| 7,332,825 | B2 * | 2/2008 | Annen | F02B 63/04 | 290/40 R |
| 7,336,002 | B2 * | 2/2008 | Kato | H02J 7/1423 | 307/10.6 |
| 7,362,005 | B2 * | 4/2008 | Leblanc | F02N 11/0866 | 320/132 |
| 7,392,871 | B2 * | 7/2008 | Severinsky | B60W 20/00 | 903/930 |
| 7,455,134 | B2 * | 11/2008 | Severinsky | B60W 10/06 | 180/65.7 |
| 7,485,977 | B2 * | 2/2009 | Annen | H02K 7/1884 | 123/3 |
| 7,509,188 | B2 * | 3/2009 | Hyatt | G06Q 10/087 | 705/28 |
| 7,520,353 | B2 * | 4/2009 | Severinsky | B60W 30/18127 | 180/65.265 |
| 7,533,746 | B2 * | 5/2009 | Yamaguchi | H02J 7/1423 | 180/65.28 |
| 7,545,121 | B2 * | 6/2009 | Bolduc | H02J 7/1423 | 320/136 |
| RE40,820 | E * | 7/2009 | Rogers | B60L 58/20 | 324/427 |
| 7,559,388 | B2 * | 7/2009 | Severinsky | B60W 10/08 | 180/65.21 |
| 7,597,164 | B2 * | 10/2009 | Severinsky | F02B 37/00 | 903/930 |
| 7,612,524 | B2 * | 11/2009 | Howell | H02J 7/1438 | 320/134 |
| 7,626,394 | B2 * | 12/2009 | Kimura | G01R 31/3842 | 320/132 |
| 7,629,699 | B2 * | 12/2009 | Annen | H02K 7/1884 | 290/1 A |
| 7,667,341 | B2 * | 2/2010 | Serdynski | F02N 11/0862 | 290/30 A |
| 7,830,117 | B2 * | 11/2010 | Ambrosio | H02J 7/0019 | 320/109 |
| 7,832,513 | B2 * | 11/2010 | Verbrugge | B60K 6/48 | 903/903 |
| 7,839,117 | B2 * | 11/2010 | Elder | B60L 3/0046 | 320/126 |
| 7,899,631 | B2 * | 3/2011 | Iwane | G01R 31/367 | 320/149 |
| 7,938,092 | B2 * | 5/2011 | Yang | F02N 11/0866 | 123/179.5 |
| 7,948,240 | B2 * | 5/2011 | Kawase | F02P 19/027 | 324/378 |
| 7,986,053 | B2 * | 7/2011 | Bass | F02N 11/0866 | 290/30 R |
| 8,004,242 | B1 * | 8/2011 | Purkey | B60R 16/033 | 320/132 |
| 8,013,611 | B2 * | 9/2011 | Elder | H01M 10/48 | 324/427 |
| 8,036,839 | B2 * | 10/2011 | Machiyama | H01M 10/486 | 320/136 |
| 8,078,339 | B2 * | 12/2011 | Oakes | H05K 3/284 | 701/1 |
| 8,115,446 | B2 * | 2/2012 | Piccard | H02J 7/342 | 320/128 |
| 8,120,364 | B2 * | 2/2012 | Elder | H01M 50/574 | 324/427 |
| 8,125,181 | B2 * | 2/2012 | Gregg | B60L 58/20 | 180/65.29 |
| 8,134,339 | B2 * | 3/2012 | Burlak | H02H 3/12 | 320/148 |
| 8,198,865 | B2 * | 6/2012 | Mirowski | H02H 3/12 | 320/148 |
| 8,214,097 | B2 * | 7/2012 | Severinsky | B60L 58/12 | 701/84 |
| 8,242,748 | B2 * | 8/2012 | Burlak | H02H 3/12 | 701/32.8 |
| 8,256,399 | B2 * | 9/2012 | Gamache | F02N 11/0803 | 123/343 |
| 8,295,950 | B1 * | 10/2012 | Wordsworth | B60H 1/3232 | 700/297 |
| 8,307,934 | B2 * | 11/2012 | Rini | A62C 3/07 | 180/271 |
| 8,350,535 | B2 * | 1/2013 | Maleus | H02J 7/0068 | 320/133 |
| 8,381,540 | B2 * | 2/2013 | Alston | H01M 10/482 | 62/236 |
| 8,381,852 | B2 * | 2/2013 | Zolman | H04B 7/212 | 180/65.285 |
| 8,441,228 | B2 * | 5/2013 | Brabec | H02J 7/342 | 180/65.21 |
| 8,490,593 | B2 * | 7/2013 | Yang | F02P 3/096 | 123/179.5 |
| 8,497,591 | B2 * | 7/2013 | Daum | B60L 15/20 | 290/31 |
| 8,518,570 | B2 * | 8/2013 | Kudo | H01M 50/569 | 320/117 |
| 8,519,563 | B2 * | 8/2013 | Lindstrom | B60R 16/033 | 307/10.6 |
| 8,541,905 | B2 * | 9/2013 | Brabec | B60L 53/00 | 320/116 |
| 8,544,575 | B1 * | 10/2013 | Scaringe | B60K 6/485 | 180/65.21 |
| 8,560,124 | B2 * | 10/2013 | Oakes | H01M 10/48 | 700/299 |
| 8,565,932 | B2 * | 10/2013 | Oakes | G05D 23/1917 | 700/299 |
| 8,602,141 | B2 * | 12/2013 | Yee | B60W 10/26 | 322/23 |

(56) References Cited

U.S. PATENT DOCUMENTS

| | | | | |
|---|---|---|---|---|
| 8,605,450 | B2 * | 12/2013 | Kaneshige | H01M 10/425<br>361/752 |
| 8,606,447 | B2 * | 12/2013 | Namuduri | F02N 11/006<br>701/22 |
| 8,630,761 | B2 * | 1/2014 | Severinsky | B60K 6/22<br>701/22 |
| 8,633,677 | B2 * | 1/2014 | Kim | H01M 10/441<br>320/140 |
| 8,667,942 | B2 * | 3/2014 | Yang | F02N 11/0866<br>123/179.5 |
| 8,723,527 | B2 * | 5/2014 | Kudo | B60L 58/12<br>320/125 |
| 8,749,080 | B2 * | 6/2014 | Bichler | B60W 20/13<br>290/1 R |
| 8,749,193 | B1 * | 6/2014 | Sullivan | H02J 1/08<br>307/10.7 |
| 8,796,987 | B2 * | 8/2014 | Scheucher | H01M 10/482<br>320/109 |
| 8,820,286 | B2 * | 9/2014 | Cole | H02K 1/2791<br>123/179.3 |
| 8,863,540 | B2 * | 10/2014 | Alston | F25B 27/00<br>62/236 |
| 8,881,504 | B2 * | 11/2014 | Gonze | F01N 9/00<br>60/284 |
| 8,928,172 | B2 * | 1/2015 | Goto | F02N 11/0814<br>307/9.1 |
| 8,957,623 | B2 * | 2/2015 | Sisk | H01M 10/48<br>320/101 |
| 8,957,686 | B2 * | 2/2015 | Ueda | G01R 31/396<br>324/426 |
| 8,981,721 | B2 * | 3/2015 | Yamauchi | H01M 10/482<br>320/134 |
| 9,004,961 | B1 * | 4/2015 | French | B63H 20/00<br>320/125 |
| 9,050,972 | B2 * | 6/2015 | Severinsky | B60W 30/18127 |
| 9,054,555 | B1 * | 6/2015 | Ward | H02J 7/04 |
| 9,102,225 | B2 * | 8/2015 | Major | B60W 20/40 |
| 9,199,543 | B2 * | 12/2015 | Brabec | H02J 7/342 |
| 9,211,855 | B2 * | 12/2015 | Hara | B60W 30/18127 |
| 9,219,294 | B2 * | 12/2015 | Albsmeier | H02J 7/00 |
| 9,287,579 | B2 * | 3/2016 | Wyatt | H01M 10/058 |
| 9,300,018 | B2 * | 3/2016 | Watson | H01M 10/441 |
| 9,331,498 | B2 * | 5/2016 | Albsmeier | H02J 7/1423 |
| 9,382,892 | B2 * | 7/2016 | Sakata | F02N 11/0829 |
| 9,385,355 | B2 * | 7/2016 | Pinon | H01M 50/224 |
| 9,389,145 | B2 * | 7/2016 | Andreae | G01M 15/102 |
| 9,404,975 | B2 * | 8/2016 | Kudo | G01R 31/3648 |
| 9,419,447 | B2 * | 8/2016 | Yamauchi | H01M 10/482 |
| 9,425,492 | B2 * | 8/2016 | Mao | H01M 10/4264 |
| 9,425,608 | B2 * | 8/2016 | Kleczewski | H02J 7/1492 |
| 9,463,698 | B2 * | 10/2016 | Severinsky | B60W 10/08 |
| 9,475,482 | B2 * | 10/2016 | Niste | B60W 20/00 |
| 9,496,588 | B2 * | 11/2016 | Nguyen | H01M 10/6551 |
| 9,496,749 | B2 * | 11/2016 | Noda | H02J 7/1423 |
| 9,525,195 | B2 * | 12/2016 | Wyatt | H01M 50/519 |
| 9,525,343 | B2 * | 12/2016 | Li | H02M 3/156 |
| 9,527,401 | B2 * | 12/2016 | Le | B60L 53/22 |
| 9,540,989 | B2 * | 1/2017 | Sanchez Perez | F02B 37/14 |
| 9,567,921 | B2 * | 2/2017 | Mollon | F02D 31/008 |
| 9,573,585 | B2 * | 2/2017 | Severinsky | B60L 50/61 |
| 9,577,469 | B2 * | 2/2017 | Ju | H02J 7/14 |
| 9,610,824 | B2 * | 4/2017 | Allen | H01M 50/249 |
| 9,634,500 | B2 * | 4/2017 | Kamata | H02J 7/0013 |
| 9,643,498 | B2 * | 5/2017 | Saint-Leger | B60L 7/14 |
| 9,650,000 | B2 * | 5/2017 | Decoster | H02J 7/1423 |
| 9,682,673 | B2 * | 6/2017 | Sakata | H02J 7/1423 |
| 9,694,697 | B2 * | 7/2017 | Brabec | H02M 3/1582 |
| 9,748,548 | B2 * | 8/2017 | Malcolm | H01M 50/519 |
| 9,768,435 | B2 * | 9/2017 | Koebler | H01M 10/425 |
| 9,776,635 | B2 * | 10/2017 | Khafagy | B60W 30/18 |
| 9,797,361 | B2 * | 10/2017 | Shibachi | F02N 11/0866 |
| 9,803,609 | B2 * | 10/2017 | Setterberg | H02J 1/10 |
| 9,819,064 | B2 * | 11/2017 | Jiang | H01M 10/06 |
| 9,821,738 | B2 * | 11/2017 | Joao | H02J 7/1423 |
| 9,845,783 | B2 * | 12/2017 | Steele | F02N 11/14 |
| 9,856,847 | B2 * | 1/2018 | Sekiguchi | F02N 11/0866 |
| 9,915,239 | B2 * | 3/2018 | Hashim | F02N 11/0866 |
| 9,941,723 | B2 * | 4/2018 | Albsmeier | H01M 10/44 |
| 9,954,207 | B2 * | 4/2018 | Koebler | H01M 10/425 |
| 9,969,292 | B2 * | 5/2018 | Thieme | B60L 58/20 |
| 10,029,572 | B2 * | 7/2018 | Sakatani | B60R 16/03 |
| 10,047,665 | B2 * | 8/2018 | Sanchez Perez | F02B 37/10 |
| 10,065,585 | B2 * | 9/2018 | Iwasaki | B60R 16/033 |
| 10,071,435 | B2 * | 9/2018 | Enyedy | F02N 11/0803 |
| 10,096,806 | B2 * | 10/2018 | Pinon | H01M 50/503 |
| 10,097,125 | B2 * | 10/2018 | Zook | H02P 9/48 |
| 10,124,793 | B2 * | 11/2018 | Ciaccio | B60L 58/27 |
| 10,158,152 | B2 * | 12/2018 | Watson | B60L 3/04 |
| 10,170,807 | B2 * | 1/2019 | Kikuchi | H01M 10/63 |
| 10,183,563 | B2 * | 1/2019 | Rayner | B62K 27/06 |
| 10,202,041 | B2 * | 2/2019 | Kudo | B60L 58/12 |
| 10,220,721 | B2 * | 3/2019 | Lee | H02J 7/0068 |
| 10,228,424 | B2 * | 3/2019 | Hindle | G01R 31/44 |
| 10,230,254 | B1 * | 3/2019 | Najmabadi | H02M 7/5387 |
| 10,256,649 | B2 * | 4/2019 | Proebstle | B60L 50/15 |
| 10,290,912 | B2 * | 5/2019 | Jiang | H01M 50/296 |
| 10,297,855 | B2 * | 5/2019 | Qiao | H02J 7/0024 |
| 10,322,616 | B2 * | 6/2019 | Ling | B60P 3/20 |
| 10,322,711 | B2 * | 6/2019 | Yamazaki | B60L 58/20 |
| 10,326,442 | B2 * | 6/2019 | Fabregas | H03K 17/687 |
| 10,374,451 | B2 * | 8/2019 | Curlett | F21L 13/00 |
| 10,432,004 | B2 * | 10/2019 | Rumbaugh | H01M 50/244 |
| 10,442,311 | B2 * | 10/2019 | Lewis | H02J 7/0045 |
| 10,513,234 | B2 * | 12/2019 | Richardson | H02J 7/1423 |
| 10,536,005 | B2 * | 1/2020 | Yang | B60R 16/033 |
| 10,587,125 | B2 * | 3/2020 | Edwards | H02J 7/0048 |
| 10,612,562 | B2 * | 4/2020 | Kindl | F02C 7/042 |
| 10,696,291 | B2 * | 6/2020 | Ciaccio | F02N 11/04 |
| 10,714,966 | B2 * | 7/2020 | Shields | H02J 7/1446 |
| 10,737,578 | B2 * | 8/2020 | Thieme | B60R 16/03 |
| 10,790,677 | B2 * | 9/2020 | Nam | G01R 31/396 |
| 10,804,733 | B2 * | 10/2020 | Koike | H01M 10/46 |
| 10,811,897 | B2 * | 10/2020 | Maekawa | H02J 7/00 |
| 10,829,067 | B2 * | 11/2020 | Lages | H02J 1/14 |
| 10,840,732 | B2 * | 11/2020 | Rumbaugh | H01M 10/613 |
| 10,850,725 | B2 * | 12/2020 | Tabatowski-Bush | H01M 10/486 |
| 10,876,510 | B2 * | 12/2020 | Ciaccio | H01M 10/44 |
| 10,886,583 | B2 * | 1/2021 | Ciaccio | H01M 50/20 |
| 10,913,443 | B2 * | 2/2021 | Chen | B60W 20/13 |
| 10,916,962 | B2 * | 2/2021 | Hida | H02J 7/14 |
| 10,928,458 | B2 * | 2/2021 | Iwane | G01R 31/367 |
| 10,933,751 | B2 * | 3/2021 | Masui | H02J 7/0068 |
| 10,933,763 | B2 * | 3/2021 | Hall | B60L 53/62 |
| 10,960,785 | B2 * | 3/2021 | Villanueva | B64U 10/25 |
| 10,978,684 | B2 * | 4/2021 | Le | H01M 50/20 |
| 10,981,557 | B2 * | 4/2021 | Ye | B60W 20/13 |
| 11,066,027 | B2 * | 7/2021 | Yasunori | B60R 16/033 |
| 11,110,811 | B2 * | 9/2021 | Gao | B64D 31/18 |
| 11,128,005 | B2 * | 9/2021 | Wyatt | H01M 10/625 |
| 11,135,934 | B2 * | 10/2021 | Smith | B60L 3/003 |
| 11,159,031 | B2 * | 10/2021 | Ohashi | H02J 7/00714 |
| 11,165,266 | B2 * | 11/2021 | Johnson | H01M 10/0525 |
| 11,171,368 | B2 * | 11/2021 | Hwang | H01M 10/4207 |
| 11,198,366 | B2 * | 12/2021 | Hirano | B60L 58/20 |
| 11,211,807 | B1 * | 12/2021 | Bailey | H02J 7/35 |
| 11,220,988 | B2 * | 1/2022 | Ciaccio | B60L 58/13 |
| 11,230,384 | B2 * | 1/2022 | Lynn | H01M 10/625 |
| 11,260,772 | B2 * | 3/2022 | Head | H01M 10/4257 |
| 11,349,144 | B2 * | 5/2022 | Qiao | H02J 7/0024 |
| 11,351,975 | B2 * | 6/2022 | Liang | B60W 10/08 |
| 11,381,103 | B2 | 7/2022 | Gonring | |
| 11,390,168 | B1 * | 7/2022 | Bryan | B60L 15/2045 |
| 11,411,421 | B2 * | 8/2022 | Komiyama | H02J 7/005 |
| 11,455,842 | B1 * | 9/2022 | Fotak | G01R 31/343 |
| 11,473,545 | B1 * | 10/2022 | Fotak | G01R 31/007 |
| 11,476,700 | B2 * | 10/2022 | Sasahara | H02J 9/061 |
| 11,479,146 | B2 * | 10/2022 | Villanueva | B60L 50/64 |
| 11,499,517 | B1 * | 11/2022 | Gopalakrishnan | F02N 11/0866 |
| 11,506,719 | B2 * | 11/2022 | Chen | F02N 11/0866 |
| 11,548,407 | B2 * | 1/2023 | Villanueva | B64U 20/96 |

(56) References Cited

U.S. PATENT DOCUMENTS 11,594,777 B2 * 2/2023 Le .......... B60K 6/28
11,611,222 B2 * 3/2023 Nook .......... H01H 19/025
11,616,262 B2 * 3/2023 Ciaccio .......... H01M 10/6556 429/7
11,641,123 B2 * 5/2023 Mashimo .......... H02J 7/00712 307/9.1
11,662,097 B2 * 5/2023 Clift .......... B29C 70/46 60/737
11,724,330 B2 * 8/2023 Ulrich .......... B23K 9/1081 219/133
11,750,007 B2 * 9/2023 Kraus .......... B60R 16/033 307/10.1
11,760,227 B2 * 9/2023 Joao .......... B60L 50/61 307/9.1
11,768,232 B2 * 9/2023 Artur Du Plessis .......... H02J 7/00714 320/116
11,768,251 B2 * 9/2023 Sung .......... B60L 58/21 701/33.6
11,794,585 B1 * 10/2023 Tokarz .......... H01H 39/006
11,794,905 B2 * 10/2023 Lynn .......... H01M 10/486
11,827,110 B1 * 11/2023 Ogram .......... B60L 53/16
11,852,114 B2 * 12/2023 Ciaccio .......... B60W 50/14
11,855,479 B2 * 12/2023 Abramov .......... H02J 7/1423
11,959,450 B2 * 4/2024 Kumar .......... F02N 11/087
11,987,131 B2 * 5/2024 Welschoff .......... B60W 30/18127
11,996,762 B2 * 5/2024 Hembach .......... H02M 1/00
12,003,133 B1 * 6/2024 Gonring .......... F02B 63/042
12,031,511 B2 * 7/2024 Wood, Sr. .......... F02N 11/0866
12,037,953 B2 7/2024 Gonring et al.
12,040,612 B1 * 7/2024 Cooper .......... H02J 3/0075
12,040,639 B2 * 7/2024 Hakushima .......... B60R 16/033
12,040,654 B2 * 7/2024 Wood, Sr. .......... F02N 11/0866
12,043,102 B2 * 7/2024 Ruiz .......... B60L 50/66
12,062,935 B2 * 8/2024 Kaewert .......... H02J 7/0013
12,087,922 B2 * 9/2024 Dietze .......... G01R 31/396
12,155,049 B2 * 11/2024 Linsmeier .......... H01M 10/625
12,158,485 B2 * 12/2024 Fukushima .......... H02J 7/0047
12,159,986 B2 * 12/2024 Linsmeier .......... H02J 7/0013
12,233,716 B2 * 2/2025 Ge .......... B60L 15/007
12,255,479 B2 * 3/2025 Takahashi .......... B60R 16/033
12,269,603 B2 * 4/2025 Lynn .......... B60L 3/0046
12,315,870 B2 * 5/2025 Wyatt .......... H01M 10/6555
12,330,530 B2 * 6/2025 Joao .......... H02J 7/00032
12,330,620 B2 * 6/2025 Ozeki .......... B60R 16/04
12,360,166 B2 * 7/2025 Lee .......... G01R 31/3648
12,411,179 B2 * 9/2025 Lee .......... H01M 10/482
12,422,497 B2 * 9/2025 Sung .......... B60L 58/21
2001/0024107 A1 * 9/2001 Jabaji .......... H02K 19/34 322/90
2001/0039230 A1 * 11/2001 Severinsky .......... F02B 37/18 180/65.23
2001/0040441 A1 * 11/2001 Ng .......... H02J 7/0032 320/104
2002/0008495 A1 * 1/2002 Dougherty .......... H02J 7/663 320/104
2002/0031700 A1 * 3/2002 Wruck .......... H01M 50/583 429/61
2002/0084118 A1 * 7/2002 Esaki .......... B60K 6/28 903/917
2002/0111756 A1 * 8/2002 Modgil .......... B60R 25/04 702/63
2002/0145286 A1 * 10/2002 Kiefer .......... H02P 9/04 290/34
2003/0160510 A1 * 8/2003 Mizutani .......... F02N 11/14 307/10.1
2003/0183191 A1 * 10/2003 Bertness .......... F02D 41/042 123/198 R
2003/0210014 A1 * 11/2003 Jabaji .......... H02J 7/007182 320/104
2003/0217876 A1 * 11/2003 Severinsky .......... B60T 8/172 180/65.23
2003/0224833 A1 * 12/2003 Egan .......... H02P 9/30 455/572
2004/0019441 A1 * 1/2004 Larson .......... H02J 7/14 702/63
2004/0189257 A1 * 9/2004 Dougherty .......... H02J 7/005 320/132
2004/0217736 A1 * 11/2004 Bischoff .......... H01M 16/00 320/119
2005/0001587 A1 * 1/2005 Bender .......... H02J 7/663 320/116
2005/0003710 A1 * 1/2005 Congdon .......... H02P 9/48 439/620.01
2005/0200201 A1 * 9/2005 Jabaji .......... H02J 7/1438 307/10.1
2005/0285445 A1 * 12/2005 Wruck .......... H02J 9/002 307/10.1
2006/0097577 A1 * 5/2006 Kato .......... H02J 7/1423 307/10.1
2006/0100057 A1 * 5/2006 Severinsky .......... B60K 6/547 180/65.23
2006/0119365 A1 * 6/2006 Makhija .......... G01R 31/007 324/380
2006/0125443 A1 * 6/2006 Bolduc .......... H02J 7/1423 320/104
2006/0201724 A1 * 9/2006 Leblanc .......... H02J 7/0013 180/65.1
2006/0231304 A1 * 10/2006 Severinsky .......... F01N 3/2013 290/40 C
2006/0231305 A1 * 10/2006 Severinsky .......... B60W 10/06 290/40 C
2006/0231306 A1 * 10/2006 Severinsky .......... B60L 15/2045 290/40 C
2006/0237246 A1 * 10/2006 Severinsky .......... B60W 20/14 290/40 C
2006/0237247 A1 * 10/2006 Severinsky .......... H01M 10/4207 180/65.23
2006/0244423 A1 * 11/2006 Henningson .......... G01R 31/386 320/150
2006/0244456 A1 * 11/2006 Henningson .......... G01R 31/007 324/378
2006/0244457 A1 * 11/2006 Henningson .......... G01R 31/3647 324/426
2006/0275632 A1 * 12/2006 Kim .......... F02N 11/0866 429/61
2007/0032915 A1 * 2/2007 Yamaguchi .......... H02J 7/1423 701/1
2007/0120366 A1 * 5/2007 Grant .......... H02K 7/1815 290/1 A
2007/0158945 A1 * 7/2007 Annen .......... H02K 7/1884 290/1 A
2007/0158946 A1 * 7/2007 Annen .......... H02K 35/04 290/1 R
2007/0158947 A1 * 7/2007 Annen .......... F02B 63/04 290/1 R
2007/0221370 A1 * 9/2007 Allen .......... B60L 50/64 62/236
2007/0227470 A1 * 10/2007 Cole .......... F02N 11/04 123/3
2008/0079264 A1 * 4/2008 Serdynski .......... H02J 7/0042 290/36 R
2008/0084182 A1 * 4/2008 Oberlin .......... H01M 10/052 320/116
2008/0172242 A1 * 7/2008 Hyatt .......... G06Q 10/087 700/286
2008/0243405 A1 * 10/2008 Iwane .......... G01R 31/3835 702/63
2008/0246443 A1 * 10/2008 Doljack .......... H02J 7/345 320/167
2009/0018707 A1 * 1/2009 Oakes .......... B60H 1/322 700/299
2009/0056661 A1 * 3/2009 Cook .......... F02N 11/0866 123/179.3
2009/0088994 A1 * 4/2009 Machiyama .......... H01M 10/48 702/63
2009/0108814 A1 4/2009 Wilkins et al.

(56) References Cited

U.S. PATENT DOCUMENTS

2009/0125184 A1* 5/2009 Oakes .......... H01M 10/441 701/99
2009/0147427 A1* 6/2009 Levinas .......... B60R 16/03 361/170
2009/0177345 A1* 7/2009 Severinsky .......... B60W 20/14 165/59
2009/0230683 A1* 9/2009 Bass .......... F02N 11/0866 290/48
2009/0261833 A1* 10/2009 Kawase .......... F02P 19/027 324/378
2009/0278509 A1* 11/2009 Boyles .......... F02N 11/0862 320/163
2009/0322288 A1* 12/2009 Merrill .......... H02J 7/24 320/153
2010/0013302 A1* 1/2010 Howell .......... H02J 7/1438 307/10.7
2010/0066302 A1* 3/2010 Gregg .......... B60L 58/20 320/136
2010/0175656 A1* 7/2010 Doub .......... F02N 11/10 123/179.3
2010/0231180 A1* 9/2010 Harmon .......... H02P 9/48 322/28
2010/0236851 A1* 9/2010 Van Maanen .......... B60L 3/0046 180/65.265
2010/0244847 A1* 9/2010 Kudo .......... G01R 31/3842 324/433
2010/0297883 A1* 11/2010 Burlak .......... H02H 3/12 439/620.21
2010/0305793 A1* 12/2010 Kidston .......... B60K 6/445 180/65.21
2010/0319645 A1* 12/2010 Yang .......... F02N 11/0866 123/179.5
2010/0319646 A1* 12/2010 Yang .......... F02N 11/14 123/179.1
2011/0001354 A1* 1/2011 Lindstrom .......... F02N 11/0866 307/9.1
2011/0004363 A1* 1/2011 Severinsky .......... B60W 10/06 62/239
2011/0011113 A1* 1/2011 Jordan .......... B60R 16/0236 62/507
2011/0012423 A1* 1/2011 Gollmer .......... H02J 7/1423 320/123
2011/0016894 A1* 1/2011 Lemon .......... B60H 1/3226 29/890.035
2011/0025273 A1* 2/2011 Lattin .......... G01R 31/3842 320/134
2011/0031046 A1* 2/2011 Zolman .......... H04B 7/212 180/54.1
2011/0068749 A1* 3/2011 Maleus .......... H02J 7/0068 320/162
2011/0163721 A1* 7/2011 Van Wiemeersch .......... H02J 9/002 320/128
2011/0184602 A1* 7/2011 Severinsky .......... B60W 20/10 703/2
2011/0190971 A1* 8/2011 Severinsky .......... B60L 53/20 219/202
2011/0210605 A1* 9/2011 Duan .......... H02J 7/0031 307/9.1
2011/0221384 A1* 9/2011 Scheucher .......... B60W 50/082 324/427
2011/0288704 A1* 11/2011 Schwarz .......... H01M 10/6571 219/202
2011/0288743 A1* 11/2011 Smith .......... B60L 50/61 701/102
2011/0288789 A1* 11/2011 Henningson .......... G01R 31/374 702/33
2011/0298424 A1* 12/2011 Yamauchi .......... B60L 58/12 320/118
2012/0022731 A1* 1/2012 Kuang .......... B60K 6/52 180/65.21
2012/0057316 A1* 3/2012 Kaneshige .......... H01M 50/213 361/752
2012/0169050 A1* 7/2012 Daum .......... B60W 20/00 290/31
2012/0212046 A1* 8/2012 Goto .......... F02D 17/04 307/9.1
2012/0223722 A1* 9/2012 Ueda .......... G01R 19/16542 324/537
2012/0235473 A1* 9/2012 Jiang .......... B60L 58/20 307/9.1
2012/0235511 A1* 9/2012 Watson .......... H02J 7/0048 307/109
2012/0235642 A1* 9/2012 Mao .......... B60L 3/04 320/112
2012/0237799 A1* 9/2012 Jiang .......... B60L 3/04 429/7
2012/0274077 A1* 11/2012 Usselman .......... F02N 11/0862 290/1 A
2012/0292918 A1* 11/2012 Bichler .......... B60K 6/105 290/1 R
2012/0303213 A1* 11/2012 Prosser .......... B60L 53/305 320/107
2013/0009465 A1* 1/2013 Bajjuri .......... H02J 1/14 307/9.1
2013/0018530 A1* 1/2013 MacMillan .......... B60R 25/045 701/2
2013/0026828 A1* 1/2013 Iwami .......... H01M 10/482 320/137
2013/0054085 A1* 2/2013 Casey .......... H02J 7/14 307/9.1
2013/0066499 A1* 3/2013 Niste .......... B60W 20/50 180/65.265
2013/0069594 A1* 3/2013 Jung .......... H01M 10/425 320/112
2013/0096752 A1* 4/2013 Severinsky .......... B60L 50/16 703/2
2013/0096753 A1* 4/2013 Severinsky .......... B60L 53/00 180/65.265
2013/0113283 A1* 5/2013 Shiek .......... H02J 7/00 307/31
2013/0127611 A1* 5/2013 Bernstein .......... H01M 10/48 340/455
2013/0162030 A1* 6/2013 Sonesson .......... B60L 1/00 307/10.1
2013/0200690 A1* 8/2013 Rini .......... H02J 7/16 307/9.1
2013/0220588 A1* 8/2013 Allen .......... B60H 1/00428 62/244
2013/0249468 A1* 9/2013 Bajjuri .......... H02J 7/342 320/109
2013/0264875 A1* 10/2013 Kaminsky .......... H01G 9/28 307/52
2013/0320772 A1* 12/2013 Qiao .......... H01M 10/4207 307/85
2013/0320931 A1* 12/2013 Yoshida .......... B60R 16/033 320/135
2013/0325257 A1* 12/2013 Waldschmidt .......... B60H 1/3232 701/36
2013/0334878 A1* 12/2013 Brabec .......... B60L 53/51 307/9.1
2014/0007833 A1* 1/2014 Yang .......... F02N 11/0866 123/179.5
2014/0026544 A1* 1/2014 Gonze .......... B60R 16/03 60/284
2014/0102187 A1* 4/2014 Andreae .......... G01M 15/102 73/114.71
2014/0131124 A1* 5/2014 Severinsky .......... H01M 10/4207 180/65.245
2014/0141290 A1* 5/2014 Pizzurro .......... H01M 10/613 429/61
2014/0159739 A1* 6/2014 Kudo .......... G01R 31/3842 324/434
2014/0184153 A1* 7/2014 Saint-Leger .......... B60L 50/53 320/108
2014/0195078 A1* 7/2014 Severinsky .......... B60L 7/18 180/65.23
2014/0210414 A1* 7/2014 Kamata .......... H01M 10/441 320/118

(56) References Cited

U.S. PATENT DOCUMENTS

2014/0253040 A1* 9/2014 Michalske ................ H02J 7/52 320/134
2014/0277791 A1* 9/2014 Lenard .................... F02D 29/06 700/287
2014/0290552 A1* 10/2014 Mueller ................. B63H 25/46 114/144 R
2014/0316650 A1* 10/2014 Waldschmidt ....... B60H 1/3226 701/36
2014/0361536 A1* 12/2014 Neet ....................... F02N 11/04 290/31
2014/0375066 A1* 12/2014 Yang ................... F02N 11/0862 290/38 R
2014/0375067 A1* 12/2014 Yang ....................... B60R 16/03 290/38 R
2015/0035356 A1* 2/2015 Sakata .................. H02J 7/0049 307/9.1
2015/0037616 A1* 2/2015 Wyatt ............... H01M 10/6555 429/153
2015/0037626 A1* 2/2015 Malcolm ............. H01M 10/613 429/90
2015/0037641 A1* 2/2015 Pinon .................. H01M 50/517 429/99
2015/0037642 A1* 2/2015 Pinon .................. H01M 50/517 429/99
2015/0037646 A1* 2/2015 Wyatt ................. H01M 10/058 29/623.2
2015/0037647 A1* 2/2015 Nguyen ............ H01M 10/6555 429/120
2015/0037649 A1* 2/2015 Wyatt ................. H01M 50/224 429/152
2015/0037656 A1* 2/2015 Noda ................ H01M 10/4264 429/149
2015/0037662 A1* 2/2015 Pinon .................. H01M 50/105 29/623.2
2015/0040861 A1* 2/2015 Mollon ................. F02D 31/001 123/339.15
2015/0112536 A1* 4/2015 Severinsky ............ B60K 6/485 180/65.265
2015/0145481 A1* 5/2015 Yamauchi ............. B60L 3/0046 320/117
2015/0153423 A1* 6/2015 Fink ..................... G01R 31/385 324/430
2015/0154816 A1* 6/2015 Chen .................... G01R 31/343 701/29.1
2015/0171640 A1* 6/2015 Lee ......................... B60L 58/14 320/109
2015/0202983 A1* 7/2015 Le ........................... B60L 50/16 320/109
2015/0275841 A1* 10/2015 Sakata ................ F02N 11/0814 123/179.28
2015/0280489 A1* 10/2015 Curlett ................... H05B 47/10 307/66
2015/0287971 A1* 10/2015 Pizzurro ............... H01M 10/63 429/61
2015/0300307 A1* 10/2015 Setterberg ............. H02J 7/1423 701/113
2015/0377203 A1* 12/2015 Neet ................... F02N 11/0866 290/31
2016/0016483 A1* 1/2016 Yasunori ............... H02J 7/1438 320/162
2016/0053737 A1* 2/2016 Solberg ................... H02J 7/977 701/113
2016/0137092 A1* 5/2016 Thieme ............... B60W 30/192 307/10.6
2016/0138550 A1* 5/2016 Kirlew ................ F02N 11/0866 290/38 R
2016/0176298 A1* 6/2016 Watson .................. B60L 58/20 307/10.6
2016/0181587 A1* 6/2016 Koebler ............. H01M 50/597 429/7
2016/0230648 A1* 8/2016 Sanchez Perez ....... F02B 37/14
2016/0236573 A9* 8/2016 Severinsky .............. B60K 6/46
2016/0241051 A1* 8/2016 Yang ..................... H01M 10/46
2016/0268645 A1* 9/2016 Koebler ................ H01M 10/52
2016/0276719 A1* 9/2016 Kikuchi .............. H01M 10/425
2016/0288746 A1* 10/2016 Namuduri ........... F02N 11/0866
2016/0297317 A1* 10/2016 Huang ...................... H02J 7/80
2016/0298589 A1* 10/2016 Setterberg ............. H02J 7/1423
2016/0303977 A1* 10/2016 Kudo .................... H02J 7/0016
2016/0318466 A1* 11/2016 Brooks ................. B60R 16/033
2016/0325812 A1* 11/2016 Mueller ................. B63H 25/46
2016/0329731 A1* 11/2016 Kokot, Jr. ................. H02J 7/32
2016/0347194 A1* 12/2016 Kanayama ........ H02J 13/00034
2017/0022955 A1* 1/2017 Steele ................. F02N 11/0866
2017/0030316 A1* 2/2017 Sekiguchi ........... F02N 11/0866
2017/0036666 A1* 2/2017 Severinsky ......... B60L 15/2045
2017/0106819 A1* 4/2017 Richardson ........... B60W 10/30
2017/0110766 A1* 4/2017 Koebler .............. H01M 50/597
2017/0122190 A1* 5/2017 Sanchez Perez ....... F02B 37/10
2017/0187371 A1* 6/2017 Fabregas .............. H03K 17/687
2017/0210194 A1* 7/2017 Ling ................ H01M 10/0525
2017/0211588 A1* 7/2017 Kindl ...................... F04D 29/22
2017/0276113 A1* 9/2017 Hashim ............... F02N 11/0866
2017/0317492 A1* 11/2017 Koebler .................. H01M 4/48
2017/0326670 A1* 11/2017 Enyedy ............... F02N 11/0814
2017/0346140 A1* 11/2017 Koebler .............. H01M 4/5825
2018/0037178 A1* 2/2018 Richardson ........... B60R 16/033
2018/0041048 A1* 2/2018 Yang ....................... B60R 16/03
2018/0083469 A1* 3/2018 Bauer .................. F02N 19/001
2018/0093656 A1* 4/2018 Yamazaki ............. B60K 6/387
2018/0099578 A1* 4/2018 Lee ...................... H02J 7/0068
2018/0115169 A1* 4/2018 Edwards .............. H02J 7/0048
2018/0233944 A1* 8/2018 Doane ................... H02J 7/1438
2018/0257506 A1* 9/2018 Thieme ................... B60L 58/20
2018/0261890 A1* 9/2018 Yan ......................... B60R 16/04
2018/0265021 A1* 9/2018 Koishi ...................... H02J 7/14
2018/0269694 A1* 9/2018 Nam ...................... G08B 21/18
2018/0301919 A1* 10/2018 Rumbaugh ........... H02J 7/0042
2018/0313903 A1* 11/2018 Hindle ............. H01M 10/4285
2018/0331544 A1* 11/2018 Dulle .................... B60L 3/0046
2018/0334158 A1* 11/2018 Chen ..................... B60W 10/30
2019/0023117 A1* 1/2019 Wolff ...................... B60L 50/16
2019/0044367 A1* 2/2019 Koike .................. H02J 7/1423
2019/0054872 A1* 2/2019 Ganiere ................ B60R 16/033
2019/0081593 A1* 3/2019 Paek ....................... H10F 19/00
2019/0118656 A1* 4/2019 Hudson ................... B60L 50/10
2019/0126763 A1* 5/2019 Najmabadi ............... H02J 7/02
2019/0176650 A1* 6/2019 Wood ...................... B60L 50/40
2019/0176803 A1* 6/2019 Tabatowski-Bush ... B60L 58/22
2019/0184837 A1* 6/2019 Najmabadi ............. H02P 27/06
2019/0198833 A1* 6/2019 Le .......................... B60L 58/12
2019/0219641 A1* 7/2019 Iwane ................. H01M 10/425
2019/0237976 A1* 8/2019 Lau ......................... H02J 1/122
2019/0237987 A1* 8/2019 Martell ................. H02J 7/0048
2019/0237988 A1* 8/2019 Maekawa ........... H02J 7/00304
2019/0245237 A1* 8/2019 Qiao ..................... H02J 7/0025
2019/0267819 A1* 8/2019 Paek ....................... H02S 50/00
2019/0296561 A1* 9/2019 Le .......................... B60L 58/20
2019/0326772 A1* 10/2019 Shields .................. B60L 50/10
2019/0389552 A1* 12/2019 Rembach .................. B63J 3/02
2020/0036206 A1* 1/2020 Rumbaugh ............. H02J 7/342
2020/0072178 A1* 3/2020 Berkson ................. B60R 16/03
2020/0083706 A1* 3/2020 Paskov ..................... H02J 1/10
2020/0124013 A1* 4/2020 Koenen .................. B08B 3/026
2020/0127479 A1* 4/2020 Johnson .................... H02J 7/00
2020/0136198 A1* 4/2020 Kasumzade ...... H01M 10/4242
2020/0153050 A1* 5/2020 Winger ............... H01M 10/425
2020/0169114 A1* 5/2020 Almeida ............... B60R 16/033
2020/0180454 A1* 6/2020 Gao ..................... B64D 27/357
2020/0204096 A1* 6/2020 Andersson ................ H02P 9/48
2020/0220369 A1* 7/2020 Kemmerer .......... F02N 11/0862
2020/0223422 A1* 7/2020 Ye .......................... B60K 6/485
2020/0276966 A1* 9/2020 Rich ..................... B60W 20/10
2020/0313247 A1* 10/2020 Colasacco ............. H01M 10/44
2020/0339010 A1* 10/2020 Villanueva .............. B60L 50/64
2020/0406705 A1* 12/2020 Vila Soler ............ B60H 1/3232
2021/0021139 A1* 1/2021 Windsor .................. B60K 1/04
2021/0053689 A1* 2/2021 Lynn .................. H01M 10/486
2021/0098831 A1* 4/2021 Dietze .................. H01M 10/48
2021/0129705 A1* 5/2021 Head ................ H01M 10/4257
2021/0152106 A1* 5/2021 Frampton ................. H02J 7/02

(56) References Cited

U.S. PATENT DOCUMENTS

2021/0162884 A1* 6/2021 Villanueva ........ H01M 10/6551
2021/0170908 A1* 6/2021 Villanueva .............. B60L 50/64
2021/0194269 A1* 6/2021 Gonring .................. H02J 1/082
2021/0206274 A1* 7/2021 Ganiere ................. H02K 7/003
2021/0218268 A1* 7/2021 Doane ................... H02J 7/0013
2021/0226287 A1* 7/2021 Le ..................... H01M 10/0525
2021/0263086 A1* 8/2021 Fukushima ......... H01M 10/486
2021/0347225 A1* 11/2021 Johnson ............. B60H 1/00428
2021/0384577 A1* 12/2021 Wyatt ................. H01M 50/503
2022/0029448 A1* 1/2022 Abramov .......... H01M 10/4207
2022/0045531 A1* 2/2022 Kraus ..................... H02J 7/855
2022/0077512 A1* 3/2022 Gerling ............. H01M 10/4257
2022/0113029 A1* 4/2022 Clift .......................... F23R 3/52
2022/0161368 A1* 5/2022 Young .................. A01D 34/006
2022/0169394 A1* 6/2022 Lynn ................... H01M 10/625
2022/0177101 A1* 6/2022 Taylor ..................... B60L 58/13
2022/0179008 A1* 6/2022 Lee ..................... H01M 10/441
2022/0205420 A1* 6/2022 Kumar .................... B60R 16/03
2022/0242276 A1* 8/2022 Day ........................ B60L 58/25
2022/0247200 A1* 8/2022 Mashimo .............. H02J 7/0048
2022/0258647 A1* 8/2022 Joao ........................ B60L 53/24
2022/0297549 A1* 9/2022 Welschoff ............... B60L 50/71
2022/0299002 A1* 9/2022 Wood, Sr. ........... F02N 11/0866
2022/0388369 A1* 12/2022 Schumacher ....... H02J 7/00032
2022/0388409 A1* 12/2022 Fotak ...................... B60L 53/24
2022/0396226 A1* 12/2022 Wood, Sr. ............. B60R 16/033
2022/0399742 A1* 12/2022 Wood, Jr. ............ F02N 11/0862
2022/0407341 A1* 12/2022 McBride ........... H02J 7/007182
2022/0407343 A1* 12/2022 Wood, Sr. ........... F02N 11/0866
2023/0015559 A1* 1/2023 Villanueva ............. B60L 50/64
2023/0036001 A1* 2/2023 Goodrich ................ H02J 3/381
2023/0054685 A1* 2/2023 Lelli ................. H01M 10/0585
2023/0114741 A1* 4/2023 Guglielmo ................ B60L 1/02
320/107
2023/0125261 A1* 4/2023 Gadamchetty ...... H01M 10/613
429/72
2023/0152388 A1* 5/2023 Sung ....................... B60L 58/21
701/33.6
2023/0173902 A1* 6/2023 Ruiz ....................... H02J 9/061
180/68.5
2023/0191928 A1* 6/2023 Fotak ...................... B60L 53/53
2023/0243895 A1* 8/2023 Sung ....................... B60L 58/21
701/33.6
2023/0264585 A1* 8/2023 Abron .................. B60K 7/0007
307/10.1
2023/0268147 A1 8/2023 DeHorn et al.
2023/0275537 A1 8/2023 Cameron et al.
2023/0336005 A1* 10/2023 Doane ....................... H02J 7/35
2023/0339587 A1* 10/2023 Watanabe .............. B63H 20/00
2023/0366935 A1* 11/2023 Lee .................... G01R 31/3648
2023/0374964 A1* 11/2023 Nook ...................... F02N 11/12
2023/0375635 A1* 11/2023 Noland ................. B60L 3/0046
2023/0382268 A1* 11/2023 Joao ........................ B60L 58/18
2023/0406118 A1* 12/2023 Ogram ................ F02N 11/0807
2024/0051417 A1 2/2024 Shmueli et al.
2024/0058634 A1* 2/2024 Linsmeier ............... B60L 58/26
2024/0059121 A1* 2/2024 Linsmeier .............. B60K 11/02
2024/0059136 A1* 2/2024 Linsmeier ................ A62C 3/16
2024/0059137 A1* 2/2024 Linsmeier ................. B60L 3/04
2024/0059151 A1* 2/2024 Linsmeier ................ A62C 3/16
2024/0059190 A1* 2/2024 Linsmeier ........... H02J 7/00309
2024/0059417 A1* 2/2024 Lynn ....................... B60L 58/26
2024/0063457 A1* 2/2024 Linsmeier ......... H01M 10/6568
2024/0063470 A1* 2/2024 Linsmeier ......... H02J 7/007194
2024/0083373 A1* 3/2024 Joao ...................... B60R 16/033
2024/0097479 A1* 3/2024 Gothoskar ........ H02J 7/007186
2024/0154412 A1* 5/2024 Nook ...................... H02J 1/122
2024/0198857 A1* 6/2024 Shread .................. H02J 7/0019
2024/0198858 A1* 6/2024 Shread .................. H02J 7/0048
2024/0223002 A1* 7/2024 Rocha .................... H02K 53/00
2024/0283281 A1* 8/2024 Clarke ................ H02J 7/00714
2024/0291296 A1* 8/2024 Burke ..................... B60L 58/18
2024/0304875 A1* 9/2024 Jin ...................... H01M 50/188
2024/0313315 A1* 9/2024 Kemp ................. H01M 10/615
2024/0356358 A1* 10/2024 Bolton ................ H01M 10/052
2024/0367498 A1* 11/2024 Harris ................. H01M 50/249
2024/0367529 A1* 11/2024 Taskas .................... B60L 50/60
2024/0399876 A1* 12/2024 Nook .................... B60L 3/0046
2025/0023122 A1* 1/2025 Jin ...................... H01M 10/425
2025/0023123 A1* 1/2025 Jin ....................... G01R 31/392
2025/0023124 A1* 1/2025 Jin ..................... G01R 31/3842
2025/0023125 A1* 1/2025 Jin ........................ H01M 50/55
2025/0035708 A1* 1/2025 Joao ................... G01R 31/3842
2025/0047113 A1* 2/2025 Fleetwood .......... B60R 16/0234
2025/0058725 A1* 2/2025 Bultman ................. F02N 11/04
2025/0116717 A1* 4/2025 Son ...................... G01R 31/389
2025/0132443 A1* 4/2025 Fairbanks ........... H01M 10/613
2025/0149905 A1* 5/2025 Lee ....................... B60W 20/50
2025/0187425 A1* 6/2025 Stoltz ..................... B60K 25/06
2025/0236247 A1* 7/2025 Shread .................. B60R 16/033
2025/0258243 A1* 8/2025 Kim ................... G01R 31/3842
2025/0258244 A1* 8/2025 Kim ................... G01R 31/3842
2025/0330036 A1* 10/2025 Tiwari .................. H02J 7/1423
2025/0389247 A1* 12/2025 Clarke ................ F02N 11/0862
2026/0003011 A1* 1/2026 Sung ....................... B60L 58/21
2026/0011793 A1* 1/2026 Sung ..................... B60L 3/0046
2026/0034901 A1* 2/2026 Nook ...................... B60L 53/14

OTHER PUBLICATIONS

Solenoids vs. relays: What is the difference?. Deuty, S. Planet Analog. (Mar. 22, 2023). https://www.planetanalog.com/relays-and-solenoids-electromechanical-devices/ (Year: 2023).*
Bowlin, T.R., "RV Battery Charging from your Tow Vehicle", RVing with TR Bowlin, Apr. 1, 2022, 30 pages.
Morton, T., "Lance Truck Camper Lithium Batteries + Alternator Charging", https://www.mortonsonthemove.com/truck-camper-lithium-alternator-charging/, downloaded Aug. 30, 2024, 41, pages.
Power Systems, Therig "Adding a 2nd Alternator for Direct Lithium Battery Charging", Feb. 23, 2021, 11 pages.

* cited by examiner

SYSTEM FOR CHARGING A HOUSE BATTERY BANK FROM AN ALTERNATOR

CROSS-REFERENCE(S) TO RELATED APPLICATION(S)

This application claims the benefit of Provisional Application No. 63/676,129, filed Jul. 26, 2024, the disclosure of which is hereby incorporated by reference herein in its entirety for all purposes.

BACKGROUND

In the last five years, lithium battery popularity has exploded for use as house (also referred to as coach or auxiliary) batteries in recreation vehicles ("RVs"), boats, and other types of vehicles. RV manufacturers are offering them as standard equipment or as an option on some models. Larger lithium batteries have recently come onto the market for increased amp hour capacity. Typically, when an RV or boat is configured for lead acid batteries for both the starting and house battery banks, the house battery merges with the starting battery for charging both on a single alternator until the ignition is turned off. This is usually accomplished through a merge solenoid that connects the battery cable between the two banks at a time when certain parameters are met after starting the engine.

Oftentimes, owners of older RV models with lead acid house batteries would like to convert the house battery bank to use lithium batteries, as lithium batteries are lighter and outperform lead acid batteries. However, it is well known that lead acid batteries are still needed as an engine starter battery (such as a chassis battery) for various reasons, so both types of batteries (both lead acid batteries and lithium batteries) will be present in the older RV models.

Some attempt conversion by just installing lithium house batteries, and using the conventional wiring of the RV. This is not a good practice, as the traditional chassis battery and the new lithium-based house battery bank need to be separated and charged on separate charging profiles to properly charge the batteries and not be influenced by each other. The lithium batteries have very little internal resistance and can take as much charging current from the alternator as it can put out. This can lead to damaging the alternator due to overheating or could overcharge and damage the lithium batteries if the charging amperage is too high for the batteries rated capacity. Also lithium batteries have a different chemistry than conventional lead acid or gel types and require a different charging profile or program in order to charge them properly. These charging specifications are specified by the lithium battery manufacturer for their battery.

In other attempts, a timed battery disconnect switch is installed between the two battery banks in place of the merge solenoid, for example, a Battery Isolation Manager (BIM). The theory is to have both battery banks connected to the alternator for a preset amount of time and then disconnect the lithium batteries for another preset amount of time to allow the alternator to rest so it does not overheat, and then repeat the cycle.

One of the most popular solutions is to install a direct current (DC) to DC charger to charge the house battery bank. This requires disconnecting the cable between the two battery banks and their loads and installing a DC to DC charger powered by the alternator and programmed for a lithium charge profile to charge the lithium battery bank. The alternator then charges only the starter battery and also powers only the chassis loads. There are several manufacturers of this type of charger and currently, the maximum output range is 30 to 50 amps. While two can be wired in parallel to increase the amperage, this still results in long charging times if wanting to fully charge a large amp hour lithium battery bank that has been run down.

Finally, some outfit the RV engine with two alternators: one for charging the starter battery and powering the chassis components, and one for charging the lithium batteries which would also power any active house components. The two battery banks and their loads would be permanently separated. As well as being used as standard equipment on some models now, there are also companies that offer kits to add a second alternator on some types of engines for this purpose. However, engines commonly used in large motorhomes (and vehicles such as rear engine buses) are not easily adapted to add a second alternator due to the serpentine belt and tensioner arrangement. It would probably need to be redesigned by the manufacturer to accommodate a second alternator.

All of these supposed solutions have significant drawbacks, as described above. Accordingly, systems and methods for charging lithium house batteries that may be added to an otherwise conventional vehicle are needed.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments, a system for charging a house battery bank in a vehicle is provided. The system comprises a disconnect solenoid electrically coupled to a starter battery and an alternator of the vehicle; and a controller monitor. The controller monitor is configured to, in response to detecting an ignition on signal and detecting a merge signal indicating an electrical connection between the house battery bank and at least one of the starter battery or the alternator, adjust a disconnect signal to cause the disconnect solenoid to disconnect the starter battery from the alternator.

In some embodiments, a method of charging a house battery bank is provided. The method comprises charging at least one house battery bank with an alternator powered by an engine; and contemporaneously charging a starter battery with a direct current (DC) to DC charger powered by the alternator.

In some embodiments, a storage mode battery switching device is provided. The storage mode battery switching device comprises a storage switch for placing the device in a storage mode. The storage switch is configured to disconnect loads from a house battery bank, connect the loads to a starter battery, and disable an engine starter solenoid by switching off a trigger wire for the engine starter solenoid.

In some embodiments, a method of charging at least one house battery bank is provided. The method comprises, in response to detecting an ignition on signal and detecting a merge signal indicating an electrical connection between a house battery bank and at least one of a starter battery or an alternator, disconnecting the starter battery from the alternator.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Disclosed herein are systems, methods, and devices for a rapid alternator-based charging system usable to charge house battery banks on RVs, boats, or other vehicles that have both a lead acid starter battery (also known as a "chassis battery") and a house battery bank (also known as a "coach battery bank" or "auxiliary battery bank") that includes lithium batteries. In some embodiments, using a single alternator, the starter battery is automatically disconnected from the alternator and DC wiring system and is automatically connected to a DC to DC charger powered from the single alternator after the engine has been started, the two battery banks have merged, and the house battery bank has been connected to the alternator. In some embodiments, the system controls the DC to DC charger using a remote On/Off signal that controls a remote On/Off of the DC to DC charger. Thus, the house battery bank may be charged by the alternator at a high charge rate using a regulator programmed with a suitable lithium battery charge profile according to the battery manufacturer's specifications, and the lead acid starter battery is being charged by a DC to DC charger programmed with a suitable lead acid charging profile.

Figure 1:
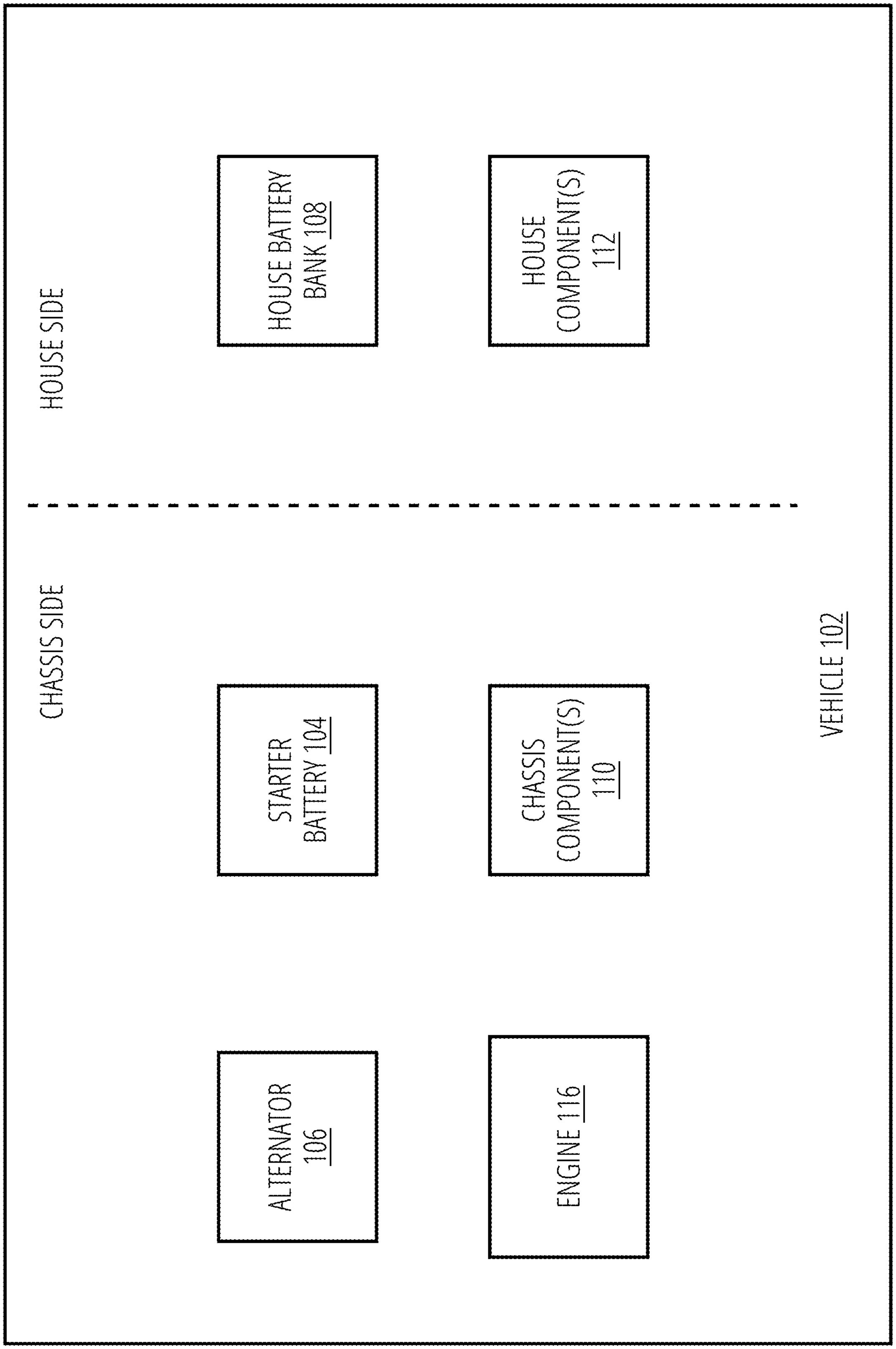
FIG. 1 is a block diagram of a non-limiting example embodiment of a vehicle that may be configured to use a system as disclosed herein, according to various aspects of the present disclosure.

FIG. 1 is a block diagram of a non-limiting example embodiment of a vehicle that may be configured to use a system as disclosed herein, according to various aspects of the present disclosure. The vehicle 102 is primarily described herein as a recreational vehicle, or RV, as RVs are an example of a type of vehicle that includes a variety of house components 112 (e.g., heating and/or cooling systems, lighting, appliances, fans, entertainment systems, etc.) that have significant power draws, and for which efficient alternator-based charging of a house battery bank 108 that includes lithium batteries is a significant technical challenge. However, in other embodiments, a different type of vehicle that has chassis components and house components powered by separate battery banks may be used, including but not limited to a commercial motor vehicle (CMV), a boat, a yacht, an aircraft, or any other type of vehicle or device having two or more battery banks of different chemistries or other incompatibilities. One will recognize that actual embodiments of vehicles 102 will have more than the illustrated components (e.g., steering components, controls, and/or other components), but that these additional components have not been illustrated or described in detail herein to avoid obscuring the invention.

As shown, the vehicle 102 includes components that are logically separated into a chassis side and a house side. The chassis side includes an engine 116, an alternator 106, a starter battery 104, and chassis components 110. The engine 116 is typically an internal combustion engine that is responsible for powering the alternator 106, providing motive power for the vehicle 102, and is otherwise the primary source for generated energy within the vehicle 102. In some embodiments, different or additional types of components may be used as the engine 116 or may generate power on the chassis side, including but not limited to a regenerative braking system, an electric turbo compound (ETC) system, or other types of systems.

Before the engine 116 is generating power, electrical power is provided to the chassis side by the starter battery 104. The starter battery 104 is typically a lead acid battery that is capable of generating a high amperage for a short amount of time in order to provide the energy for starting the engine 116. In addition to powering the components for starting the engine 116, the starter battery 104 may also provide power for other chassis components 110. In some embodiments, the starter battery 104 may be coupled to the house components 112 as well, and may provide backup power to the house components 112 in the absence of power from the alternator 106 or the house battery bank 108.

The alternator 106 is an electrical generator that is powered by the engine 116. When the engine 116 is running, the alternator 106 provides electrical power to the other components in the vehicle 102. In some embodiments, a stock alternator 106 for the vehicle 102 may be used. In some embodiments, a high-output alternator capable of voltage up to or over 14.5 volts may be used. One non-limiting example of a high-output alternator 106 is a Balmar by Domestic Group alternator, manufactured by CDI Electronics, Inc. Another non-limiting example of a high-output alternator is the IdlePro Extreme 4000 series of high-amp brushless alternators manufactured by Prestolite Electric Incorporated, including the pad mount type used on the Cummins ISL9, which range from 220 amps to 440 amps. In some embodiments, the system is capable of a charge rate of about 250 amps to about 350 amps when the alternator is set at a 90% field output. In some embodiments, a single engine alternator 106 capable of 350 A output may charge only the lithium batteries in the house battery bank 108 while powering all DC loads when the engine 116 is running. The alternator 106 may be paired with a remote regulator 204, as described below.

The chassis components 110 may include any electrically powered system that would typically be present on a vehicle 102 and powered by the alternator 106 and/or the starter battery 104. While the components for starting the engine 116 (e.g., a starter motor, glow plugs, etc.) were described as being part of the chassis components 110 above, the chassis components 110 may also include other components typically included in vehicles, including but not limited to headlights, cabin lights, driver compartment heating and/or cooling systems, vehicle sensors, dashboard displays, etc.

On the house side, the vehicle 102 includes a house battery bank 108 and house components 112. The house battery bank 108 is a collection of one or more batteries that provide power to the house components 112. The house components 112 are additional components that are not typically powered by the alternator 106 or the starter battery 104, and that provide additional functionality not necessarily related to operating the vehicle 102 as a vehicle. For example, house components 112 of an RV may include lighting, entertainment systems, appliances, HVAC for a living compartment, communications equipment, and/or other types of devices. In order to better service the power needs of the house components 112, the house battery bank 108 often includes lithium batteries, which have special charging requirements as described elsewhere herein.

Figure 2A:
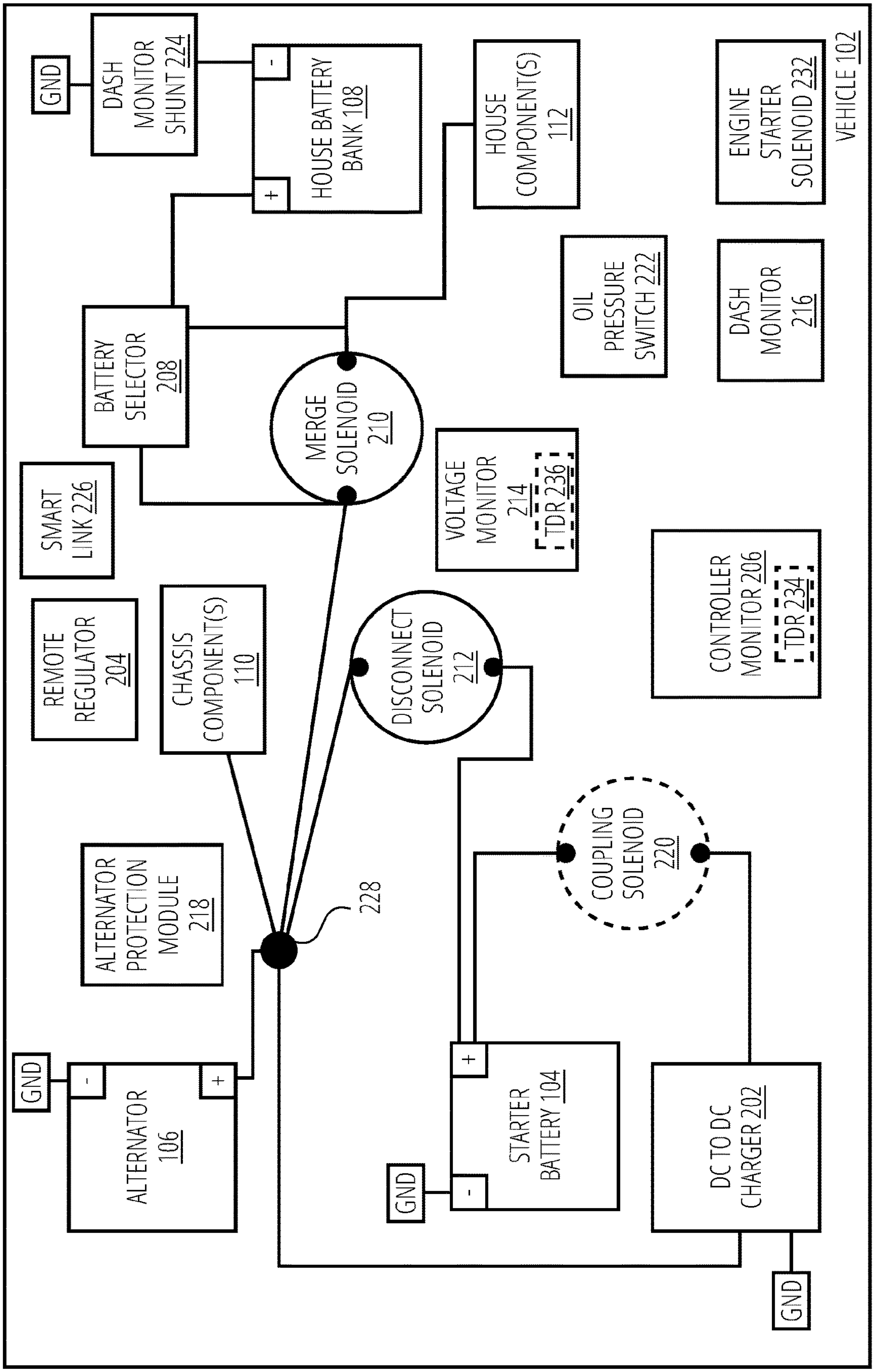
FIG. 2A and FIG. 2B are detailed schematic diagrams of additional components of the vehicle 102, according to various aspects of the present disclosure.
Figure 2B:
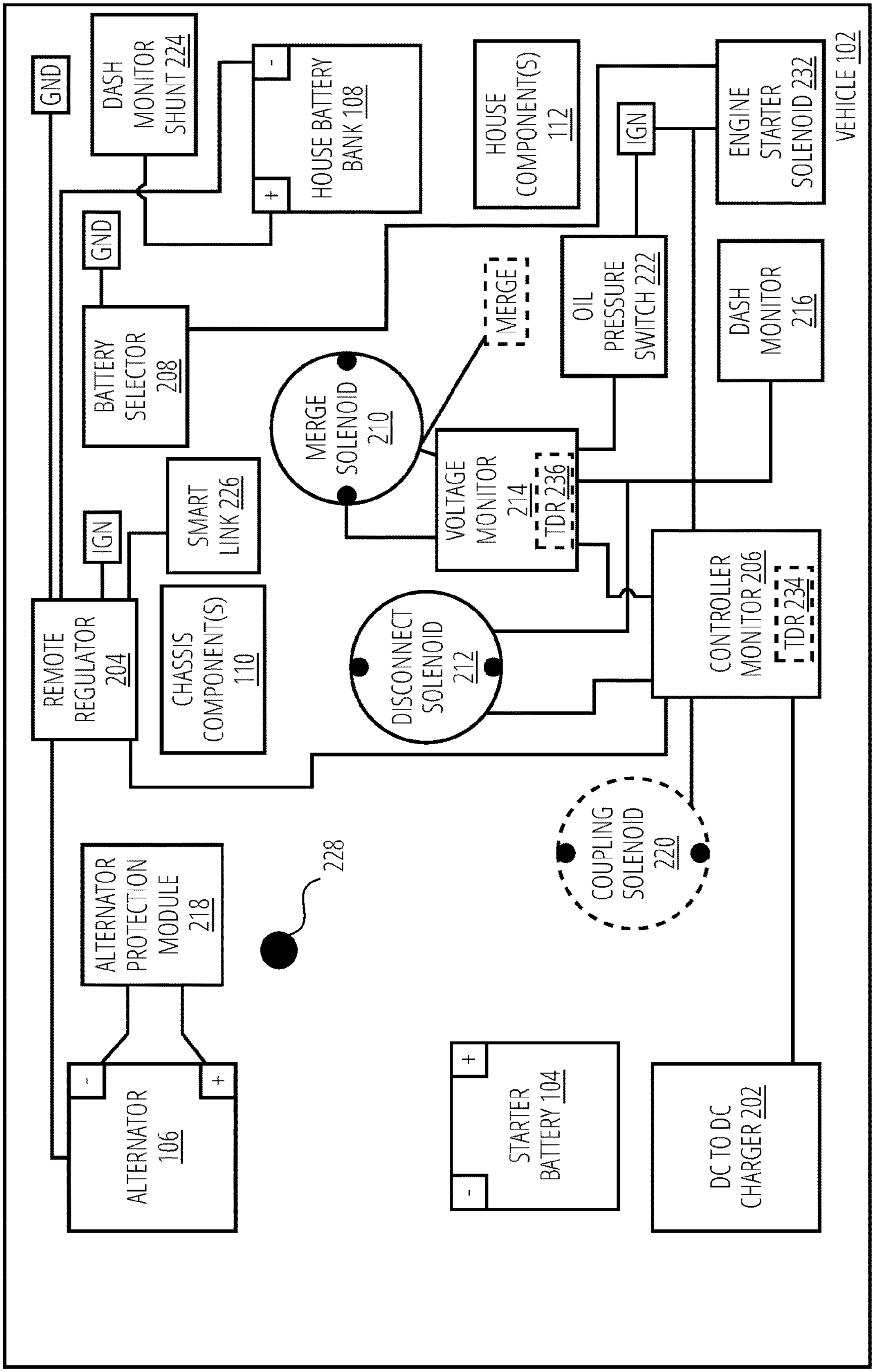

FIG. 2A and FIG. 2B are detailed schematic diagrams of additional components of the vehicle 102, according to various aspects of the present disclosure. FIG. 2A primarily illustrates connections between components that transfer battery power, and FIG. 2B primarily illustrates connections between components that provide communication and/or sensing signals.

As shown in FIG. 2A and FIG. 2B, the vehicle 102 includes a DC to DC charger 202, a remote regulator 204, a controller monitor 206, a battery selector 208, a merge solenoid 210, a disconnect solenoid 212, a voltage monitor 214, a dash monitor 216, an alternator protection module 218, a coupling solenoid 220, an oil pressure switch 222, an engine starter solenoid 232, a dash monitor shunt 224, and a smart link 226. In these figures, the starter battery 104, alternator 106, house battery bank 108, chassis components 110, and house components 112 are the same as illustrated in FIG. 1, to show how the other components may be added to the vehicle 102 to improve its charging efficiency, though some of the other additional components illustrated in FIG. 2A and FIG. 2B may also be stock components provided in an unmodified vehicle 102. Some of the components illustrated in FIG. 2A and FIG. 2B that are not illustrated in FIG. 1 (e.g., the DC to DC charger 202, the disconnect solenoid 212, etc.) may be aftermarket components added to the vehicle 102, while some of the components illustrated in FIG. 2A and FIG. 2B that are not illustrated in FIG. 1 (e.g., the engine starter solenoid 232, etc.) may be standard components of the vehicle 102 that were omitted from FIG. 1 for the sake of clarity. In some embodiments, the merge solenoid 210 may be provided as a stock component of the vehicle 102, while in other embodiments, the merge solenoid 210 may be an aftermarket component.

FIG. 2A primarily illustrates connections between components that transfer battery power. Suitable sized battery cables should be used for the expected amperage and length consideration for the connections between the illustrated components. For example, the wires connecting the alternator 106 to the starter battery junction 228, the house battery bank 108 to the dash monitor shunt 224/ground bus, the house battery bank 108 to the battery selector 208, the battery selector 208 to the house side of the merge solenoid 210, and the house side of the merge solenoid 210 to the house components 112 may be expected to carry the most load, and may be provided by 4/0 wires at a minimum; the wires connecting the starter battery junction 228 to the merge solenoid 210, and the chassis side of the merge solenoid 210 to the battery selector 208 may be expected to carry less load, and may be provided by 2/0 wires at a minimum or a pair of such wires; the wires connecting the starter battery junction 228 to the disconnect solenoid 212 and connecting the disconnect solenoid 212 to the positive terminal of the starter battery 104 may carry less load still, and may be provided by 1/0 wires at a minimum; and the wires connecting the positive terminal of the starter battery 104 to the coupling solenoid 220, the coupling solenoid 220 to the DC to DC charger 202, and the DC to DC charger 202 to the starter battery junction 228 may carry the least load, and may be provided by #6 AWG wires at a minimum. In some embodiments, cables with a temperature rating of at least 105° C. may be used. Typically, the higher the temperature rating, the more amperage the cable can handle at the same size. In other embodiments, other weights and/or numbers of wires may be used for the illustrated connections between components that carry power.

FIG. 2B primarily illustrates connections between components that provide sensing and/or command signals. Any suitable type of wiring for connecting the components, including but not limited to wires between #12 and #18 gauge, inclusive. In some embodiments, the illustrated connections may include multiple wires to carry multiple different signals between the components.

In some embodiments, the DC to DC charger 202 is electrically connected to receive power via the alternator 106, and is electrically connected to the starter battery 104 to provide charging power via the coupling solenoid 220. The charging status of the DC to DC charger 202 is controlled by the remote On/Off signal received via a signaling connection to the controller monitor 206. Any suitable device may be used for the DC to DC charger 202. One non-limiting example of a suitable device is the 30 amp Victron 12/12-30, non-isolated with Bluetooth. Another non-limiting example is a similar 50 amp model provided by Victron, or devices provided by other providers.

In some embodiments, the merge solenoid 210 a normally open (N/O) solenoid rated for at least 500 amps. Once the alternator 106 is charging, a merge signal is sent and the merge solenoid 210 closes to connect the starter battery 104 and the house battery bank 108. In some embodiments, the merge solenoid 210 and functionality may be a stock feature of the vehicle 102 if the vehicle 102 was provided with a stock lead acid house battery bank. In some embodiments, the merge signal may be provided by a separate controller, such as a Spyder Controls controller. In some embodiments, the merge signal may be provided by the voltage monitor 214, as described in further detail below.

In some embodiments, the disconnect solenoid 212 is a normally closed (N/C) solenoid that may be rated for at least 250 amps for disconnecting the starter battery 104 from the chassis components 110 and the alternator 106 upon receiving a signal from the controller monitor 206. In some embodiments, a continuous duty type of solenoid is used, and an economizer coil is preferred.

In some embodiments, the coupling solenoid 220 is a normally open (N/O) continuous duty solenoid that may be rated for at least 60 amps, and is configured to connect the starter battery 104 to the DC to DC charger 202 upon receiving a coupling signal from the controller monitor 206.

In some embodiments, the remote regulator 204 is a programmable device that controls the charging of the house battery bank 108. The remote regulator 204 may be programmed with a suitable charging profile that corresponds to the specifications of the batteries in the house battery bank 108. Some embodiments of the remote regulator 204 may include functionality such as Bluetooth communication. In some embodiments, the remote regulator 204 may receive signals from alternator sensors and/or battery temperature sensors to further refine the charging profile, and/or may include alternator shut-down protections. Any suitable device may be used for the remote regulator 204. One non-limiting example of a suitable device is the MC-618 remote regulator from Balmar, which is widely used in the marine industry and is programmable for lithium batteries.

In some embodiments, the controller monitor 206 is configured to perform at least three functions: transmit the disconnect signal to the disconnect solenoid 212 that disconnects the starter battery 104 from the alternator 106, transmit the coupling signal to the coupling solenoid 220 to connect the starter battery 104 to the DC to DC charger 202, and transmit the remote On/Off signal to the DC to DC charger 202 to cause the DC to DC charger 202 to begin charging the starter battery 104. The controller monitor 206 also monitors conditions on the vehicle 102 to ensure that these signals are only transmitted at appropriate times, and that the signals are terminated when the conditions are no longer appropriate.

In some embodiments, the battery selector 208 is configured to selectively couple the house battery bank 108 to the house components 112. In general, lithium batteries should be disconnected completely from all amp draw while in storage, and should not be left on any type of charger. Accordingly, the battery selector 208 includes a switch that may be used to disconnect the house battery bank 108 while the vehicle 102 is in storage and not being used (a common activity for vehicles such as RVs or boats). After disconnecting the house battery bank 108, the battery selector 208 may keep the house components 112 active by coupling the starter battery 104 instead of the house battery bank 108 to the house components 112 for power. In some embodiments, the battery selector 208 may also disable an engine starter solenoid 232 so that the engine 116 cannot be started while in the storage mode, which could cause a huge current draw from, for example, a diesel engine preheat system, that could overwhelm the circuits for the house components 112. In some embodiments, having the battery selector 208 disable the starter also prevents the signals from being generated that cause the disconnect solenoid 212 to disconnect the starter battery 104.

In some embodiments, a storage mode battery switching method is provided that includes disconnecting loads (such as house components 112) from a house battery bank 108 to enter a storage mode, connecting the loads to a starter battery 104 while in the storage mode, and disabling an engine starter solenoid by switching off one trigger wire for the engine starter solenoid while in the storage mode. In some embodiments, a manual switch for the engine starter solenoid may be used. In some embodiments, the engine starter solenoid of the vehicle may include a disable switch which may be incorporated into the battery selector 208 or other battery switches of the system, so a second, manual switch is unneeded.

In some embodiments, the voltage monitor 214 is configured to monitor various voltages within the vehicle 102, and to either generate or pass on the merge signal in response to determining that the voltages indicate that the system is ready to connect the house battery bank 108 to the alternator 106 and disconnect the starter battery 104.

In a first embodiment, the voltage monitor 214 is configured to receive the merge signal generated by the vehicle 102, and to refrain from passing on the merge signal to the controller monitor 206 unless all conditions for doing so are met. In this embodiment, the voltage monitor 214 includes a dual pole dual throw (DPDT) relay and a voltage monitoring relay. The merge signal is received by the voltage monitor 214 from, for example, a Spyder Controls controller or other controller of the vehicle 102 that generates the merge signal. A voltage sense wire from the chassis side of the merge solenoid 210 (or other appropriate location) connects to one pole of the DPDT relay of the voltage monitor 214, and the merge signal wire connects to the other pole of the DPDT relay. When the ignition on signal is generated, the DPDT is energized, both connections are made, and are sent to the relay of the voltage monitor 214. This DPDT relay therefore keeps the voltage monitoring relay inactive until the ignition on signal is generated, and keeps the merge signal from passing through to the controller monitor 206 unless the ignition on signal is also being generated. If the voltage monitor 214 detects that the merge signal voltage or the ignition on signal voltage is outside of a preconfigured voltage range for each signal, the voltage monitor 214 may be configured to sever the connection of the merge signal, causing the starter battery 104 to be reconnected to the alternator 106, causing the starter battery 104 to be disconnected from the DC to DC charger 202, and causing the remote On/Off signal to be discontinued (thereby turning off the DC to DC charger 202).

In a second embodiment, the voltage monitor 214 is configured to generate the merge signal itself, once an appropriate vehicle state is detected. In this embodiment, the voltage monitor 214 is configured to receive a signal from the oil pressure switch 222. The signal from the oil pressure switch 222 indicates that the engine 116 has turned over and is running, such that the oil pressure within the engine 116 has reached a minimum pressure. Once this signal is received, the signal from the oil pressure switch 222 is provided to a time delay relay 236 internal to the voltage monitor 214. Once a preconfigured time delay has been reached, the time delay relay 236 sends the signal from the oil pressure switch 222 as the merge signal to the merge solenoid 210 and to the controller monitor 206. Any suitable time may be used for the preconfigured time delay, including but not limited to a time within a range of 10 seconds to 30 seconds, such as 20 seconds, or any other suitable time. In this second embodiment, a voltage sense wire electrically connected to the alternator side of the merge solenoid 210 may also be present, and a relay of the voltage monitor 214 may prevent the merge signal from being generated/transmitted unless the sensed voltage is within a predetermined range.

In some embodiments, the voltage monitor 214 may generate output for monitoring and/or diagnostics. For example, the voltage monitor 214 may generate output indicating that the ignition on signal is detected, that the merge signal is detected, that the merge signal is being transmitted out from the voltage monitor 214, and/or whether a voltage fault is detected. In some embodiments, the output may cause one or more LEDs or other displays to be illuminated to indicate the presence of the various states.

In some embodiments, the dash monitor 216 includes a lithium battery monitor placed at the driver's station of the vehicle 102, and may use a dash monitor shunt 224 (e.g., a shunt rated at 500 amps) on the negative battery cable of the house battery bank 108. One non-limiting example of a suitable dash monitor 216 is the Victron 712S monitor. There are other devices available on the market suitable for use as a dash monitor 216, including but not limited to a device provided Balmar. However, the shunts provided for such devices may not be rated for the expected amperage at that point of the system.

In some embodiments, the alternator protection module 218 is configured to protect the alternator 106 from surges and other out-of-specification voltage events that may be generated by lithium batteries in the house battery bank 108. The alternator protection module 218 may provide load dump protection, surge protection, and/or other protections from voltage states generated by the connection and/or disconnection of the house battery bank 108. One non-limiting example of a suitable device to be used as the alternator protection module 218 is the Balmar APM12. This example should not be seen as limiting, as other devices may also be suitable, including but not limited to various devices made by Sterling.

In some embodiments, the smart link 226 is a device that allows for monitoring and programming of the remote regulator 204. The smart link 226 may be capable of communication via Bluetooth or other wireless technology with other devices in order to report status of the remote regulator 204 and/or the charging/discharging of the house battery bank 108, to reprogram the remote regulator 204, or for other purposes.

In some embodiments, the oil pressure switch 222 is a normally open switch that closes to generate a signal when the oil pressure within the engine 116 reaches a minimum operating pressure (e.g., about 5 psi, or some other suitable pressure). This is different from a stock oil pressure switch, which is typically a normally closed switch that, in its default position, causes an oil pressure dashboard indicator to remain lit until the pressure reaches the minimum operating pressure, at which point the stock oil pressure switch is opened and the oil pressure dashboard indicator is turned off.

Figure 3B:
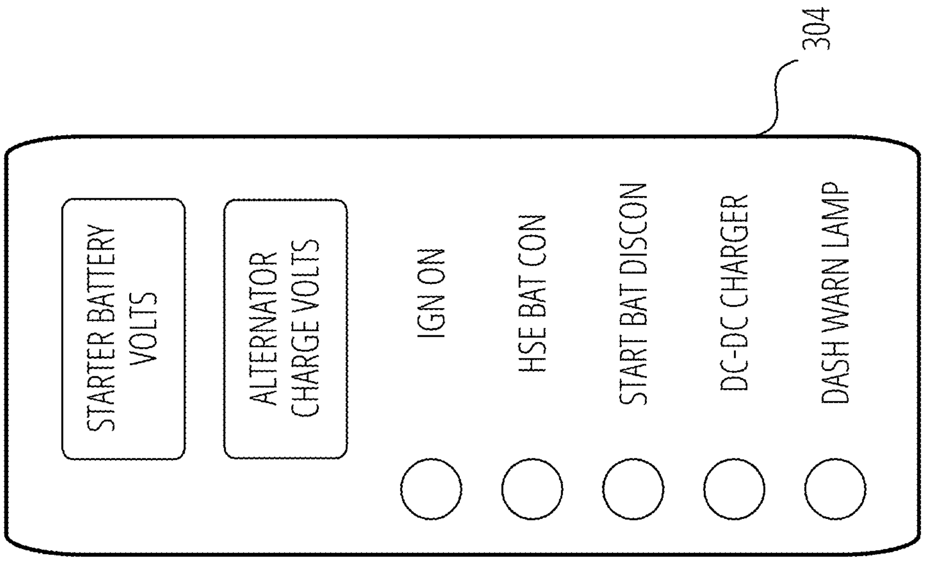
FIG. 3A and FIG. 3B are illustrations of non-limiting example embodiments of monitoring information provided according to various aspects of the present disclosure.
Figure 3A:
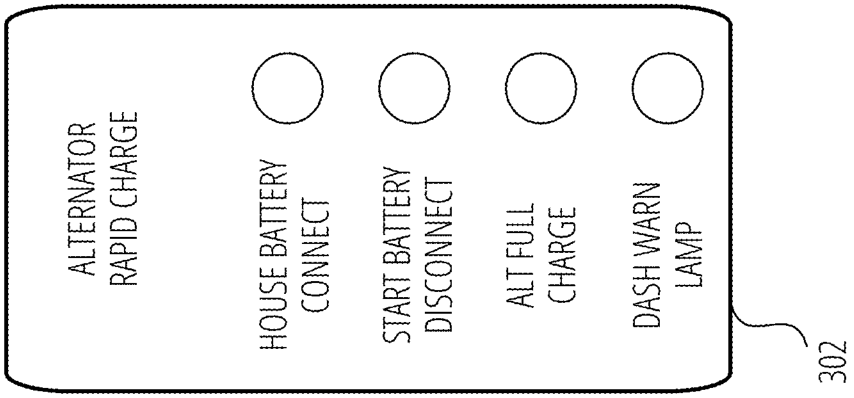

FIG. 3A and FIG. 3B are illustrations of non-limiting example embodiments of monitoring information provided according to various aspects of the present disclosure. In FIG. 3A, a dash monitor 302 is illustrated. The dash monitor 302 may be mounted on the dashboard of the vehicle 102 to allow a driver to view the status of the charging system, and may include one or more of an indicator light to indicate that the house battery bank 108 is connected to the alternator 106 (i.e., the merge signal is being generated), an indicator light to indicate that the starter battery 104 is disconnected from the alternator 106 (i.e., the disconnect signal is being generated), an indicator light generated by the remote regulator 204 to indicate that the alternator 106 is providing a full charge power, and/or an indicator light generated by the remote regulator 204 to indicate a dashboard warning. In some embodiments, the dash monitor 302 may also include a manual switch to allow the driver to manually disconnect the house battery bank 108 from the alternator 106 and reconnect the starter battery 104 to the alternator 106.

In FIG. 3B, a control box monitor 304 is illustrated. The control box monitor 304 may also be mounted on the dashboard of the vehicle 102, or may be mounted on a housing of the voltage monitor 214 or the controller monitor 206. As shown, the control box monitor 304 includes one or more of a display of the voltage of the starter battery 104 detected at the terminal of the starter battery 104 (to indicate a state of charge of the starter battery 104), a voltage detected at the starter battery junction 228 that is being generated by the alternator 106, and/or one or more indicator lights indicating whether the ignition on signal is detected, whether the house battery bank 108 is connected (i.e., whether the merge signal is detected/the merge solenoid 210 is closed), whether the starter battery 104 is disconnected (i.e., whether the disconnect signal is detected/the disconnect solenoid 212 is open), whether the DC to DC charger 202 is active (i.e., whether the remote On/Off signal is detected), and/or whether a dashboard warning lamp is illuminated. In some embodiments, each of these indicator lights may be electrically connected to the components that receive the associated signals, and so may be illuminated when the associated signals are generated in order to show the state of the system.

Figure 4A:
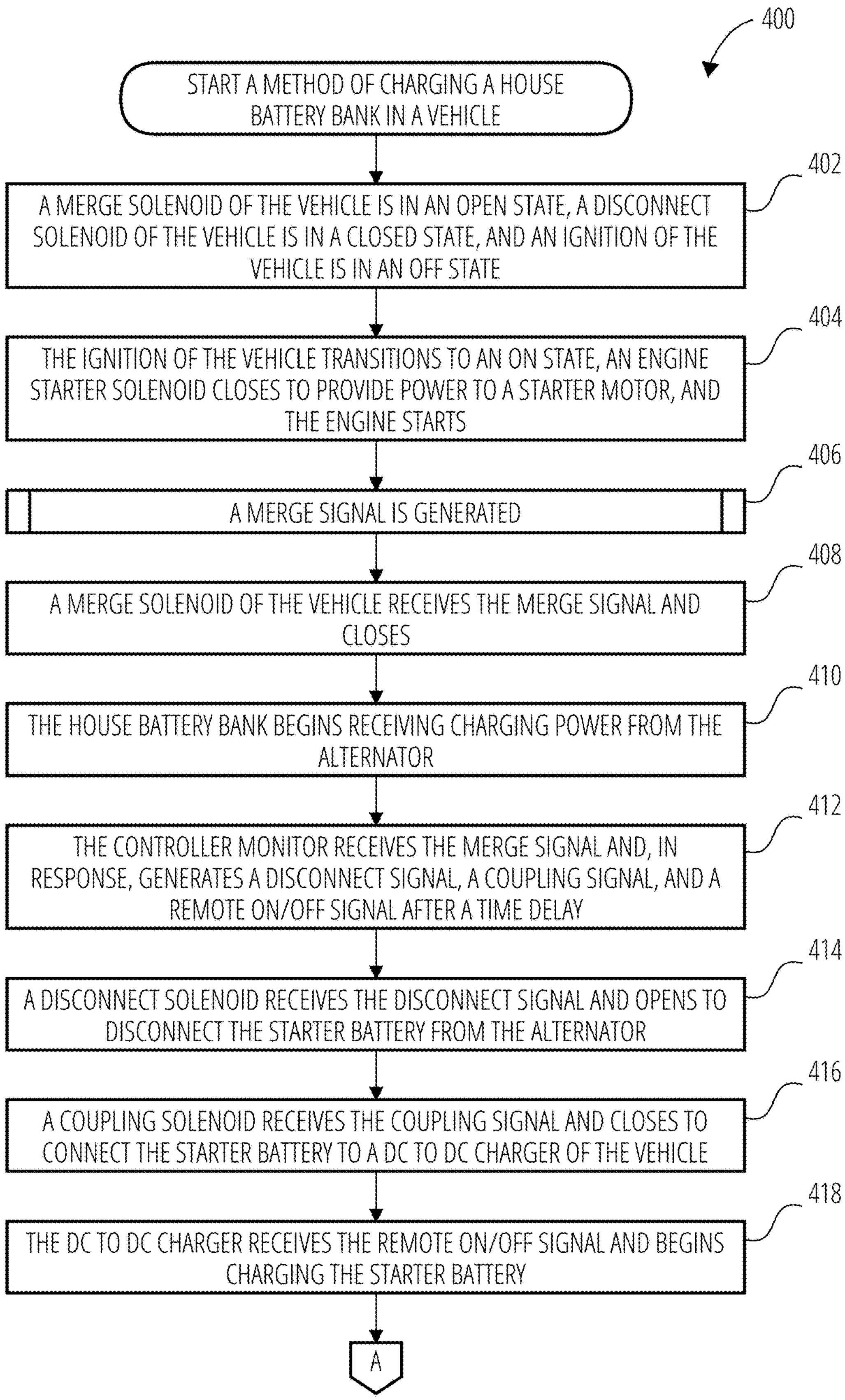
FIG. 4A-FIG. 4B are a flowchart that illustrates a non-limiting example embodiment of a method of charging a house battery bank in a vehicle, according to various aspects of the present disclosure
Figure 4B:
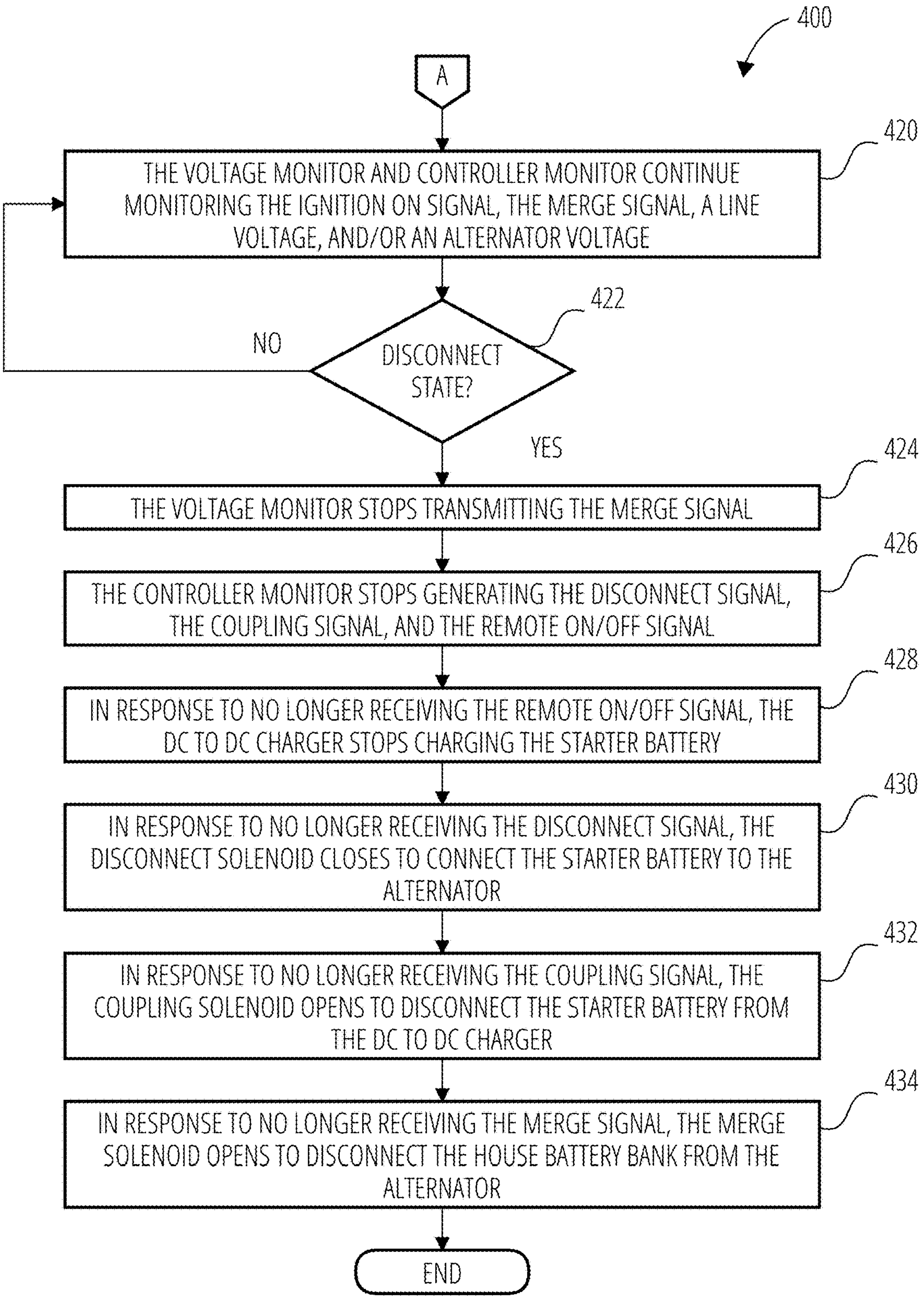

FIG. 4A-FIG. 4B are a flowchart that illustrates a non-limiting example embodiment of a method of charging a house battery bank in a vehicle, according to various aspects of the present disclosure. In the method 400, the alternator 106 is used to safely charge the house battery bank 108 even when the house battery bank 108 includes lithium batteries, and power is provided to the starter battery 104 using a DC to DC charger 202. The controller monitor 206 and other components of the system ensure that the appropriate components are coupled to each other at appropriate times in order to ensure the safety of the charging operation.

From a start block, the method 400 proceeds to block 402, where a merge solenoid 210 of the vehicle 102 is in an open state, a disconnect solenoid 212 of the vehicle 102 is in a closed state, and an ignition of the vehicle 102 is in an off state. In this initial state with the ignition off, there are no electrical components of the charging system energized or active, though the starter battery 104 may be providing power to one or more chassis components 110, and the house battery bank 108 may be providing power to one or more house components 112. It should also be noted that the merge solenoid 210 is normally open, the disconnect solenoid 212 is normally closed, and the coupling solenoid 220 is normally open, meaning that when none of the components are energized, the starter battery 104 is electrically coupled to the starter battery junction 228 (and therefore the alternator 106), while the DC to DC charger 202 is electrically disconnected from the starter battery 104 and the house battery bank 108 is electrically disconnected from the starter battery junction 228 (and therefore the alternator 106). It is also to be assumed that, in the description of the method 400, the battery selector 208 is configured to couple the house battery bank 108 to the house components 112 and the rest of the system, as opposed to being isolated from these components in the storage mode.

At block 404, the ignition of the vehicle 102 transitions to an "on" state, an engine starter solenoid 232 closes to provide power to a starter motor, and the engine 116 starts. This may occur when a driver turns a key to ignite the engine, may occur when a driver actuates a push-button start switch, or using any other suitable technique. Transitioning the ignition to the "on" state causes an ignition on signal to be transmitted by various electronics of the vehicle 102 to various components, including but not limited to the remote regulator 204, the voltage monitor 214, the DC to DC charger 202, and/or the controller monitor 206 (see FIG. 2B).

Figure 5A:
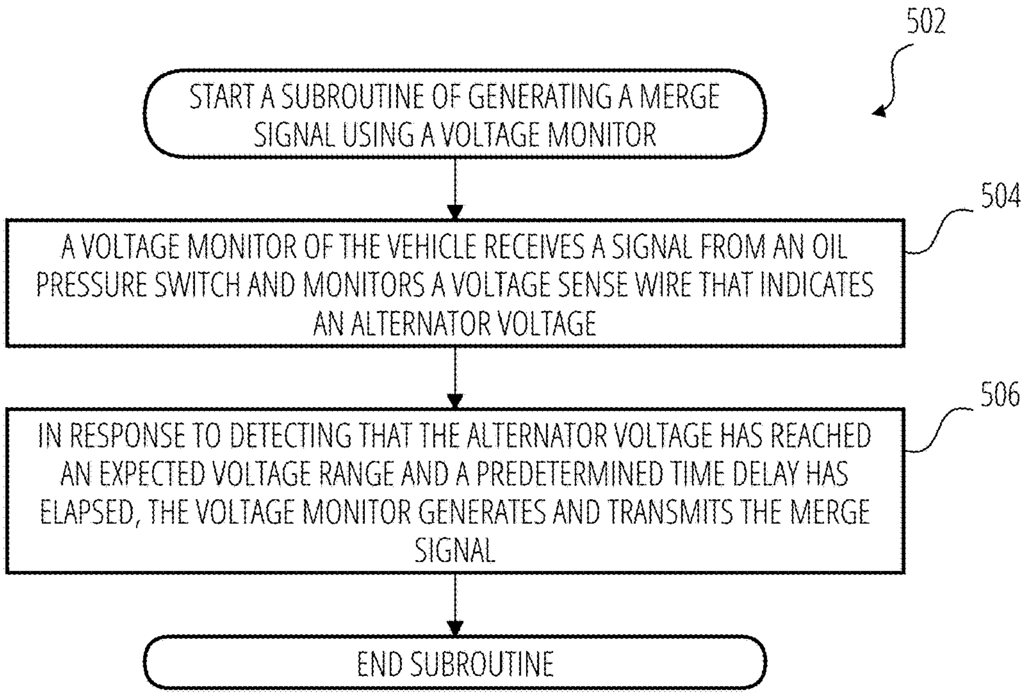
FIG. 5A is a flowchart that illustrates a non-limiting example embodiment of a subroutine of generating a merge signal using a voltage monitor, according to various aspects of the present disclosure.
Figure 5B:
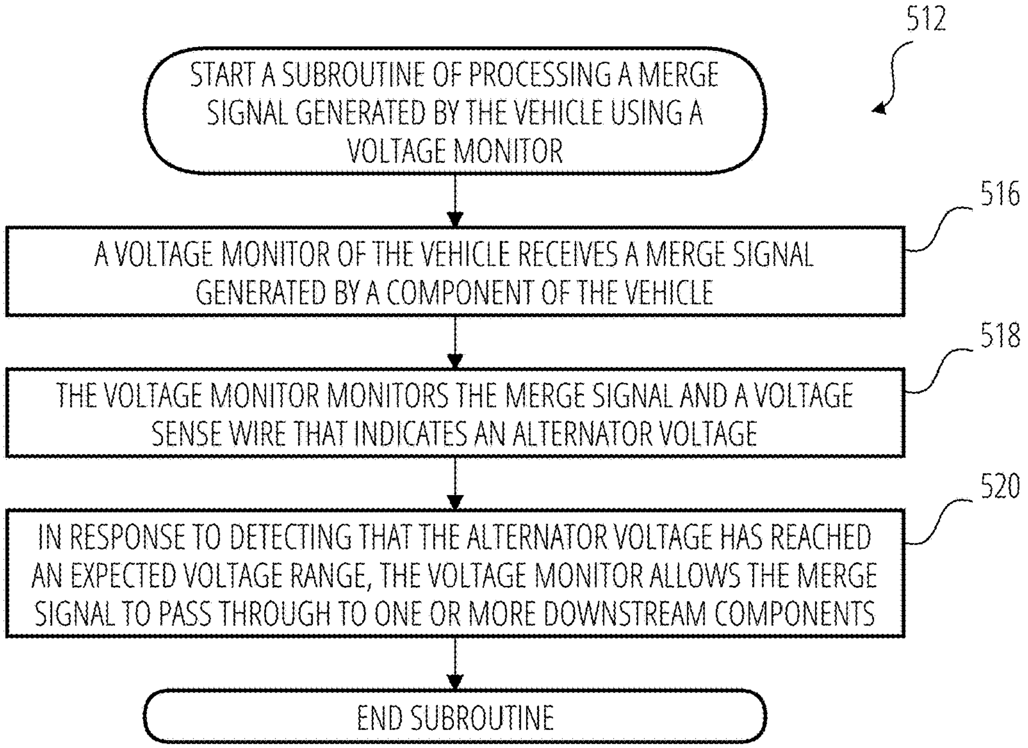
FIG. 5B is a flowchart that illustrates a non-limiting example embodiment of a subroutine of processing a merge signal generated by the vehicle using a voltage monitor, according to various aspects of the present disclosure.

At subroutine block 406, a merge signal is generated by a component of the vehicle 102 and is processed or generated by the voltage monitor 214. In some embodiments, the merge signal is generated by the voltage monitor 214 when the voltage monitor 214 detects an appropriate state of the vehicle. Such an embodiment is illustrated in FIG. 5A. In some embodiments, the merge signal is generated by another component of the vehicle 102 and is processed by the voltage monitor 214. Such an embodiment is illustrated in FIG. 5B.

At block 408, a merge solenoid 210 of the vehicle 102 receives the merge signal (either from the voltage monitor 214 or from the separate controller) and closes to connect the house battery bank 108 and the starter battery 104. As shown in FIG. 2A, the house battery bank 108 is connected to one pole of the merge solenoid 210, and the starter battery junction 228 is connected to the other pole of the merge solenoid 210, such that closing the merge solenoid 210 causes these components to be electrically connected. At block 410, because the merge solenoid 210 has closed, the house battery bank 108 begins receiving charging power from the alternator 106.

At block 412, a controller monitor 206 of the vehicle 102 receives the merge signal and, in response, generates a disconnect signal, a coupling signal, and a remote On/Off signal after a time delay. In some embodiments, the controller monitor 206 may include a time delay relay 234, which may be used to delay the generation of the disconnect signal, the coupling signal, and the remote On/Off signal after the merge signal is received in order to allow the house battery bank 108 to start charging. The time delay relay 234 within the controller monitor 206 may be configured to use any suitable amount of delay, including but not limited to a delay in the range of 30-90 seconds, such as 60 seconds.

At block 414, a disconnect solenoid 212 receives the disconnect signal and opens to disconnect the starter battery 104 from the alternator 106. As shown in FIG. 2A, the starter battery junction 228 is connected to one pole of the disconnect solenoid 212, and the starter battery 104 is connected to the other pole of the disconnect solenoid 212, such that opening the disconnect solenoid 212 causes the starter battery 104 to be electrically decoupled from the starter battery junction 228 (and therefore the alternator 106).

At block 416, a coupling solenoid 220 receives the coupling signal and closes to connect the starter battery 104 to a DC to DC charger 202 of the vehicle 102. A first pole of the coupling solenoid 220 is connected to the DC to DC charger 202, and a second pole of the coupling solenoid 220 is connected to the starter battery 104, such that closing the coupling solenoid 220 causes the starter battery 104 to be electrically connected to the DC to DC charger 202.

At block 418, the DC to DC charger 202 receives the remote On/Off signal and begins charging the starter battery 104. The DC to DC charger 202 receives power from the alternator 106 via the starter battery junction 228, and provides charging power to the starter battery 104 via the coupling solenoid 220. In some embodiments, the DC to DC charger 202 may use a charging profile configured for the starter battery 104.

One will recognize that while the actions from block 414 to block 418 that are performed in response to receiving various signals are illustrated in series, this is for clarity and ease of discussion only, and that in some embodiments, at least some portion of these actions may occur contemporaneously, or with a desired timing that may be provided by time delay relays in either the controller monitor 206 or other components. Once the actions of block 414 to block 418 are completed, the alternator 106 is free to safely charge the house battery bank 108 at a high amp charge rate as directed by the remote regulator 204 in accordance with a charging profile of the lithium batteries in the house battery bank 108 while it is also powering all current and active DC loads (i.e., the chassis components 110, the house components 112, and the DC to DC charger 202).

The method 400 then proceeds to a continuation terminal ("terminal A"). From terminal A (FIG. 4B), the method 400 proceeds to block 420, where the voltage monitor 214 and controller monitor 206 continue monitoring the ignition on signal, the merge signal, a line voltage, and/or an alternator voltage. In some embodiments, the voltage monitor 214 may monitor whether one or more of these voltages are within expected voltage ranges, and/or whether one or more of these signals are present or absent.

The method 400 then proceeds to decision block 422, where a determination is made regarding whether the monitoring of block 420 has detected a disconnect state. In some embodiments, the disconnect state is a state in which the house battery bank 108 should be automatically disconnected from the alternator 106 for safety and/or operational reasons. In some embodiments, the disconnect state may include a state wherein any one of the merge signal, the line voltage, the ignition on signal, the signal from the oil pressure switch 222, or the alternator voltage leaves its corresponding expected voltage range. In some embodiments, the expected voltage range for at least one of the merge signal or the ignition on signal may indicate a presence or an absence of the corresponding signal.

During normal operation of the system, the disconnect state should not be detected, as each of these voltages should remain within the expected voltage ranges. The expected voltage ranges may be breached due to a BMS disconnect, a power disconnect due to a battery switch, a faulty solenoid, or another electrical failure. In some embodiments, the disconnect state may be initiated manually by a driver of the vehicle 102 by actuating a switch or other control component that interrupts at least one of the expected signals from reaching the voltage monitor 214. This may be initiated using any suitable technique, including but not limited to interrupting the merge signal from being provided to the controller monitor 206 or the voltage monitor 214.

If it has not been determined that the monitoring has detected a disconnect state, then the result of decision block 422 is NO, and the method 400 returns to block 420 to continue monitoring. Otherwise, if it has been determined that a disconnect state has been detected, then the result of decision block 422 is YES, and the method 400 proceeds to block 424. One will note that while the actions from block 420 to decision block 422 are illustrated as a loop, in some embodiments this functionality is provided by a trigger, sensor, switch, or other responsive technique that does not use a logical loop, but is illustrated in FIG. 4B as a loop for the case of discussion only.

At block 424, the voltage monitor 214 stops transmitting the merge signal (i.e., stops generating the merge signal or interrupts the merge signal received from a separate controller), and at block 426, the controller monitor 206 stops generating the disconnect signal, the coupling signal, and the remote On/Off signal.

At block 428, in response to no longer receiving the remote On/Off signal, the DC to DC charger 202 stops charging the starter battery 104. In some embodiments, this may involve the DC to DC charger 202 turning off an output that charges the starter battery 104.

At block 430, in response to no longer receiving the disconnect signal, the disconnect solenoid 212 closes to connect the starter battery 104 to the alternator 106. As a normally closed solenoid, not receiving the disconnect signal causes the disconnect solenoid 212 to return to its normal, closed state, and for the starter battery 104 to be electrically coupled to the starter battery junction 228.

At block 432, in response to no longer receiving the coupling signal, the coupling solenoid 220 opens to disconnect the starter battery 104 from the DC to DC charger 202. As a normally open solenoid, not receiving the coupling signal causes the coupling solenoid 220 to return to its normal, open state, and for the starter battery 104 to be disconnected from the DC to DC charger 202.

At block 434, in response to no longer receiving the merge signal, the merge solenoid 210 opens to disconnect the house battery bank 108 from the alternator 106. As a normally open solenoid, not receiving the merge signal causes the merge solenoid 210 to return to its normal, open state, and for the house battery bank 108 to be disconnected from the starter battery junction 228 (and therefore the alternator 106).

One will recognize that while the actions from block 428 to block 434 that are performed in response to no longer receiving various signals are illustrated in series, this is for clarity and ease of discussion only, and that in some embodiments, at least some portion of these actions may occur contemporaneously.

The method 400 then proceeds to an end block and terminates. In some embodiments, instead of terminating, the components may continue to monitor to determine whether the disconnect state is resolved, and if so, it may return to block 438 to again couple the house battery bank 108 to the alternator 106 when appropriate.

FIG. 5A is a flowchart that illustrates a non-limiting example embodiment of a subroutine of generating a merge signal using a voltage monitor, according to various aspects of the present disclosure. The subroutine 502 is an example of a technique to be used at subroutine block 406 of FIG. 4A.

From a start block, the subroutine 502 proceeds to block 504, where a voltage monitor 214 of the vehicle 102 receives a signal from an oil pressure switch 222 and monitors a voltage sense wire that indicates an alternator voltage. As the engine 116 turns over, the alternator 106 begins generating energy, and the voltage of the starter battery 104 dips in response to powering a starting motor and/or other chassis components 110 during the ignition process. By monitoring the voltage from the starter battery 104 and detecting when it has reached a predetermined range, the voltage monitor 214 can determine when the engine 116 and alternator 106 have completed their start-up and have reached a steady state. In some embodiments, the voltage monitor 214 may also monitor a signal provided by the oil pressure switch 222 to determine when the startup process of the engine 116 has completed, as the oil pressure switch 222 will transmit a signal when oil pressure within the engine 116 has reached a desired operating range.

At block 506, in response to detecting that the alternator voltage has reached an expected voltage range (and, in some embodiments, that the signal from the oil pressure switch 222 is detected and/or the ignition on signal is received) and a predetermined time delay has elapsed, the voltage monitor 214 generates and transmits the merge signal. In some embodiments, the voltage monitor 214 transmits the merge signal to the controller monitor 206 and the merge solenoid 210. In some embodiments, the time delay may be provided by a time delay relay that is configured to provide a predetermined time delay before passing the merge signal to other components.

The subroutine 502 then proceeds to an end block and returns control to its caller.

FIG. 5B is a flowchart that illustrates a non-limiting example embodiment of a subroutine of processing a merge signal generated by the vehicle using a voltage monitor, according to various aspects of the present disclosure. The subroutine 512 is another example of a technique to be used at subroutine block 406 of FIG. 4A.

From a start block, the subroutine 512 proceeds to block 516, where a voltage monitor 214 of the vehicle 102 receives a merge signal generated by a component of the vehicle 102. In some embodiments, the merge signal may be generated by another controller (e.g., a Spyder Controls controller, see the dashed "merge" box in FIG. 2B).

At block 518, the voltage monitor 214 monitors the merge signal and a voltage sense wire that indicates an alternator voltage. Similar to block 504, by monitoring the voltage from the starter battery 104 and detecting when it has reached a predetermined range, the voltage monitor 214 can determine when the engine 116 and alternator 106 have completed their start-up and have reached a steady state.

At block 520, in response to detecting that the alternator voltage has reached an expected voltage range, the voltage monitor 214 allows the merge signal to pass through to one or more downstream components. In some embodiments, the voltage monitor 214 transmits the merge signal to the controller monitor 206, but the merge solenoid 210 may have received the merge signal directly from the generating component. In some embodiments, the component that generates the merge signal (e.g., Spyder Controls) and transmits it to the merge solenoid 210 and the voltage monitor 214 may insert its own time delay prior to generating the merge signal, and so the voltage monitor 214 may not insert an additional time delay prior to passing on the merge signal once the other conditions that it senses are satisfied.

The subroutine 512 then proceeds to an end block and returns control to its caller.

The methods and systems described above provide fully automated and protected alternator charging for a house battery bank that disconnects the starter battery and rapidly and safely charges large amp-hour house battery banks that include lithium batteries. Embodiments of the disclosed system and method can charge the house battery banks at a high amperage rate of up to about 300 amps (or more, with a more powerful alternator), at a charge voltage per battery manufacturer specifications (14.5+/− volts), to 100% SOC (state of charge), and to 0 amp hours consumed. Embodiments of the disclosed system may also synchronize the BMS (lithium battery battery management system). A single high output alternator and programmable external regulator may be used, and a second alternator is not needed just for charging the starter battery. A large house battery bank that uses lithium batteries may be charged in a couple of hours while driving the vehicle 102, which was not possible with previous systems.

This represents a surprising advancement in lithium battery charging for RVs and other vehicles that use lithium batteries for house battery banks. In order to develop this system, multiple principles of conventional wisdom were challenged. For example, it is widely believed alternators will not fully charge lithium batteries because they will not charge at 14.5 volts. Though this is true for a lot of alternators, including stock alternators provided for charging a lead acid battery, some embodiments of the system disclosed herein may use a single high output alternator that is commercially available and capable of fully charging to 14.5 V.

Another common belief is that the alternator will overcharge and damage lithium batteries, so a DC to DC charger should be used to control the charging of the house battery bank if the house battery bank includes lithium batteries. However, in designing the system disclosed herein, it was found that if the lithium batteries are being charged from the alternator with a suitable remote regulator on a correct lithium battery charge program based on charging recommendations of the battery manufacturer, there should only be a concern of overcharging if the lithium batteries are not rated for the charge rate the alternator is putting out.

As yet another example, it is commonly believed that a regulator monitors the battery temperature and adjusts the charge rate. In developing the system disclosed herein, it was determined that lithium batteries have low resistance and do not heat up when being charged like lead acid batteries. However, they cannot accept a charge below freezing or higher than a certain specified temperature. The manufacturers' battery specifications show discharge and charge temperature ranges. Both the Victron monitor and the Balmar remote alternator regulator have temperature sensor options (see, e.g., the connection between remote regulator 204 and the negative terminal of the house battery bank 108 illustrated in FIG. 2B). The Victron battery temperature sensor connects to the positive side of the house battery bank 108, and/or individual batteries in the house battery bank 108. It can be used to monitor the ambient temperature in the battery compartment or the temperature of the positive battery cable when charging at a high amperage. The Balmar remote regulator has a programmable temperature sensor for the alternator, which can be set to back off the charging rate if the alternator temperature is too high and falls out of the programed range. It also has a programmable battery temperature sensor that connects to the negative side of the battery cable, that can be used for programming a high and a low ambient temperature to reduce the alternators charging output if the ambient temperature falls outside the programmed settings. The real time battery temperature readings can also be used for ambient temperature monitoring or comparing with the Victron positive battery cable temperature when charging at high amps.

Additionally, industry concerns dissuaded those in the field from the technology disclosed herein. Specifically, there is a concern that an alternator will overheat and burn up if trying to charge lithium batteries too fast. It is also thought that, because of the low internal resistance on lithium batteries, they will cause the alternator to max out and overheat ("smoke the alternator"). While this may be a concern with any alternator used for charging lithium batteries, with the proper alternator, remote regulator program and sensors, the system disclosed herein does not experience this issue. Balmar makes several models of remote regulators, one of which, the MC-618, has a higher field voltage rating that can operate the Prestolight high output alternator which is rated to run at a temperature of 125° C., and also has a programmable field output setting. This is adjustable for the percentage of field output in order to be able to lower the amp output of the alternator if the alternator is rated at a higher amperage than the house battery bank maximum charge rate or if the battery cables or components are not rated for the amperage of the alternators rated output. It also can be used to lower the charge rate so the alternator is not running full bore in the bulk charging stage, working hard and potentially overheating. In some embodiments, the system is set at 90% to avoid these issues.

Further, there is a concern that if the lithium battery BMS disconnects the lithium battery from the alternator it can damage the alternator, damage the remote regulator, or burn up the wiring. This is definitely a concern, and also a concern with any two-alternator charging system, where one alternator is charging only the lithium batteries. In fact, if an alternator loses electrical connection with any type of battery, including lead acid, it will cause the same type of damage. The voltage monitor 214 disclosed herein can help detect voltage spikes, and can reconnect the starting battery in the case of these circumstances.

TESTED EMBODIMENT

Testing was carried out on a 2018 Tiffin Allegro Bus (an example recreational vehicle, or "RV") with a Cummins ISL9 diesel engine. It came equipped with an absorbent glass mat (AGM) house battery bank, a lead acid battery, as an option. It is an all-electric coach (i.e., with no propane) and has a residential refrigerator. When boondocking, it could barely get through a night without having to connect to shore power or run the generator to charge the house battery bank.

Research was conducted regarding the possibility of converting the house battery bank to lithium batteries. A conventional system was purchased, including a battery isolation manager (BIM). The conventional system included batteries from Battle Born: three 270 amp hour batteries (having a total of 810 amp hours). The specifications on these batteries showed a charge rate of up to 135 A per battery or 405 A maximum charge rate for the battery bank. The conventional system also included a BIM as a solution to protect the alternator when charging both the house battery bank and the starter battery at once with the alternator, which was later removed as the alternator overheating issue was not a problem with this engine and the stock alternator set up. Also included in the conventional system was a Victron 712S battery monitor for the lithium battery-based house battery bank that measures the input and output amps, state of charge, amp hours consumed, and more. It was installed in the dash for driver monitoring and it also had Bluetooth capability for a real time read out, history, and programming via the app.

This conventional system yielded an alternator charging rate that was unacceptably slow. The conventional system was charging the lithium batteries at a rate of 25 to 30 amps, and after a half day of driving, the state of charge on the house battery bank had barely risen. The method of installing a DC to DC charger on the house battery bank would not have improved the charge rate much, if any.

In order to improve the charging performance of the house battery bank 108, an embodiment of the system described above was implemented, by connecting the smaller starter battery 104 to the DC to DC charger 202 after the engine has started, and using a high output alternator 106, with a remote regulator 204 programmed for a lithium charging profile to charge the larger house battery bank 108 that included the lithium batteries. On a typical automobile, once the engine has started, the alternator is powering all the DC loads then present, and any excess amps from the output of the alternator are being used to charge the starter battery, throttled by the regulator that senses the battery voltage. At this point, the starter battery is just being charged and not being used for anything. Accordingly, the system described above where the starter battery 104 is placed on the DC to DC charger 202 and a high output alternator 106 is used to charge the house battery bank 108 at a faster rate than a DC to DC charger could ever put out provided significant improvements.

A first design was implemented for lithium battery conversion on an RV that would rapidly charge the house battery bank 108 having lithium batteries, and would interface with the stock as-built DC power distribution layout by utilizing the stock merge solenoid, stock cabling between the two battery banks, and existing multiplex networking program (Spyder Controls). Since building the system, and due to the complexity and wiring requirements, it was determined that a more closely integrated system may provide additional advantages.

In designing the system, the first issue was that the starter battery 104 is connected to the starter and alternator 106 system through large battery cables for initially starting the engine. Then, after starting, it is disconnected from the DC chassis components 110 and the alternator 106, so it can be charged from the DC to DC charger 202. A normally closed solenoid (the disconnect solenoid 212) was used to disconnect the battery cable, triggered by something after the engine has started, and after the alternator 106 has been connected to the house battery bank 108 through the merge solenoid 210. The controller monitor 206 was designed for this task, and was designed to be signaled to disconnect and reconnect when needed. By trial and error and rewiring several times a solution was found: the controller monitor 206 is wired in such a manner that no relays or components are live or active with the ignition off. If the controller monitor 206 loses the ignition on signal, indicating that the engine is off, or the merge signal, indicating that the house battery bank 108 has been disconnected from the alternator 106, or detects a voltage spike or other out-of-range voltage from the voltage monitor 214, the starter battery 104 will instantly be reconnected to the DC cable system and alternator 106 by the disconnect solenoid 212.

This embodiment was implemented in the vehicle for experimental purposes during the January through March time frame of 2024. It performed throughout an entire 5000-mile trip starting Apr. 2, 2024. With the implementation of this system, charge rates of the house battery bank 108 were increased to up to 300 amps, well under the 405-amp maximum combined rate specification. To obtain these rates, a high amp brushless alternator 106 and a remote regulator 204 programmed for charging lithium batteries were installed. The controller monitor 206 controlled the disconnect solenoid 212 for the starter battery 104 and also the coupling solenoid 220 for connecting/disconnecting the DC to DC charger and the starter battery 104. It also included displays for two voltage readings which are different when in the disconnect mode, and controlled LEDs used for monitoring and diagnostics.

The present application may reference quantities and numbers. Unless specifically stated, such quantities and numbers are not to be considered restrictive, but representative of the possible quantities or numbers associated with the present application. Also, in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

Embodiments disclosed herein may utilize circuitry in order to implement technologies and methodologies described herein, operatively connect two or more components, generate information, determine operation conditions, control an appliance, device, or method, and/or the like. Circuitry of any type can be used. In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

An embodiment includes one or more data stores that, for example, store instructions or data. Non-limiting examples of one or more data stores include volatile memory (e.g., Random Access memory (RAM), Dynamic Random Access memory (DRAM), or the like), non-volatile memory (e.g., Read-Only memory (ROM), Electrically Erasable Programmable Read-Only memory (EEPROM), Compact Disc Read-Only memory (CD-ROM), or the like), persistent memory, or the like. Further non-limiting examples of one or more data stores include Erasable Programmable Read-Only memory (EPROM), flash memory, or the like. The one or more data stores can be connected to, for example, one or more computing devices by one or more instructions, data, or power buses.

In an embodiment, circuitry includes a computer-readable media drive or memory slot configured to accept signal-bearing medium (e.g., computer-readable memory media, computer-readable recording media, or the like). In an embodiment, a program for causing a system to execute any of the disclosed methods can be stored on, for example, a computer-readable recording medium (CRMM), a signal-bearing medium, or the like. Non-limiting examples of signal-bearing media include a recordable type medium such as any form of flash memory, magnetic tape, floppy disk, a hard disk drive, a Compact Disc (CD), a Digital Video Disk (DVD), Blu-Ray Disc, a digital tape, a computer memory, or the like, as well as transmission type medium such as a digital and/or an analog communication medium (e.g., a fiber optic cable, a waveguide, a wired communications link, a wireless communication link (e.g., transmitter, receiver, transceiver, transmission logic, reception logic, etc.). Further non-limiting examples of signal-bearing media include, but are not limited to, DVD-ROM, DVD-RAM, DVD+RW, DVD-RW, DVD-R, DVD+R, CD-ROM, Super Audio CD, CD-R, CD+R, CD+RW, CD-RW, Video Compact Discs, Super Video Discs, flash memory, magnetic tape, magneto-optic disk, MINIDISC, non-volatile memory card, EEPROM, optical disk, optical storage, RAM, ROM, system memory, web server, or the like.

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Generally, the embodiments disclosed herein are non-limiting, and the inventors contemplate that other embodiments within the scope of this disclosure may include structures and functionalities from more than one specific embodiment shown in the figures and described in the specification.

In the foregoing description, specific details are set forth to provide a thorough understanding of exemplary embodiments of the present disclosure. It will be apparent to one skilled in the art, however, that the embodiments disclosed herein may be practiced without embodying all the specific details. In some instances, well-known process steps have not been described in detail in order not to unnecessarily obscure various aspects of the present disclosure. Further, it will be appreciated that embodiments of the present disclosure may employ any combination of features described herein.

The present application may include references to directions, such as "vertical," "horizontal," "front," "rear," "left," "right," "top," and "bottom," etc. These references, and other similar references in the present application, are intended to assist in helping describe and understand the particular embodiment (such as when the embodiment is positioned for use) and are not intended to limit the present disclosure to these directions or locations.

The present application may also reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value. The term "based upon" means "based at least partially upon."

The principles, representative embodiments, and modes of operation of the present disclosure have been described in the foregoing description. However, aspects of the present disclosure, which are intended to be protected, are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure as claimed.

While illustrative embodiments have been illustrated and described, it will be appreciated that various changes can be made therein without departing from the spirit and scope of the invention.

EXAMPLES

The following paragraphs include a numbered set of non-limiting example embodiments of the subject matter disclosed herein.

Example 1: A system for charging a house battery bank in a vehicle, the system comprising: a disconnect solenoid electrically coupled to a starter battery and an alternator of the vehicle; and a controller monitor configured to: in response to detecting an ignition on signal and detecting a merge signal indicating an electrical connection between the house battery bank and at least one of the starter battery or the alternator: adjust a disconnect signal to cause the disconnect solenoid to disconnect the starter battery from the alternator.

Example 2: The system of Example 1, wherein the vehicle is a recreational vehicle (RV), a commercial motor vehicle (CMV), a boat, a yacht, an aircraft, a device having two or more battery banks of different chemistry, or a device having two or more battery banks having an incompatibility.

Example 3: The system of any one of Examples 1-2, further comprising a voltage monitor coupled to a merge solenoid, wherein the voltage monitor is configured to: activate after receiving the ignition on signal and the merge signal, and send the merge signal to the controller monitor.

Example 4: The system of Example 3, wherein the controller monitor is further configured to adjust the disconnect signal to cause the disconnect solenoid to reconnect the starter battery to the alternator in response to at least one of the merge signal being removed or the ignition on signal being removed.

Example 5: The system of any one of Examples 3-4, wherein the controller monitor further comprises: a time delay relay configured to receive the merge signal from the voltage monitor and configured to delay the adjustment of the disconnect signal.

Example 6: The system of any one of Examples 3-5, further comprising a coupling solenoid electrically coupled to the starter battery and a direct current (DC) to DC charger; wherein the controller monitor is further configured to: in response to detecting the merge signal indicating the electrical connection between the house battery bank and at least one of the starter battery or the alternator: adjust a coupling signal to cause the coupling solenoid to connect the starter battery to the DC to DC charger.

Example 7: The system of Example 6, wherein the controller monitor is further configured to: adjust the coupling signal to cause the coupling solenoid to disconnect the DC to DC charger from the starter battery in response to at least one of the merge signal being removed or the ignition on signal being removed.

Example 8: The system of any one of Examples 6-7, wherein the controller monitor is further configured to: selectively transmit a remote On/Off signal to control a remote On/Off of the DC to DC charger, and wherein the controller monitor is further configured to: in response to detecting the merge signal indicating the electrical connection between the house battery bank and at least one of the starter battery or the alternator: adjust the remote On/Off signal to turn the DC to DC charger on.

Example 9: The system of Example 8, wherein the controller monitor is further configured to: adjust the remote On/Off signal to turn the DC to DC charger off in response to at least one of the merge signal being removed or the ignition on signal being removed.

Example 10: The system of any one of Examples 8-9, wherein the controller monitor further comprises: at least one time delay relay configured to receive the merge signal from the voltage monitor and configured to delay the adjustment of at least one of the coupling signal or the remote On/Off signal.

Example 11: The system of any one of Examples 8-10, wherein the voltage monitor is further configured to monitor a line voltage, an alternator voltage, or both the line voltage and the alternator voltage.

Example 12: The system of Example 11, wherein the voltage monitor is further configured to monitor a voltage between the alternator and the house battery bank, and wherein the controller monitor is further configured to: adjust the disconnect signal to cause the disconnect solenoid to reconnect the starter battery to the alternator in response to detecting at least one of: a loss of the ignition on signal; a loss of the merge signal; or a signal from the voltage monitor indicating that the line voltage, the alternator voltage, or both of the line voltage and the alternator voltage between the alternator and the house battery bank is above or below an expected voltage range.

Example 13: The system of any one of Examples 11-12, wherein monitoring the line voltage, the alternator voltage, or both the line voltage and the alternator voltage comprises comparing at least one of the line voltage or the alternator voltage to at least one of a first voltage threshold or a second voltage threshold.

Example 14: The system of Example 13, wherein the voltage monitor is further configured to: in response to determining that at least one of the line voltage or the alternator voltage is above the first voltage threshold or below the second voltage threshold, adjust the disconnect signal to cause the disconnect solenoid to reconnect the starter battery to the alternator.

Example 15: The system of any one of Examples 13-14, wherein the voltage monitor is further configured to: in response to determining that at least one of the line voltage or the alternator voltage is above the first voltage threshold or below the second voltage threshold: adjust at least one of the coupling signal to cause the coupling solenoid to disconnect the DC to DC charger from the starter battery or the remote On/Off signal to turn off the DC to DC charger.

Example 16: A method of charging a house battery bank, comprising: charging at least one house battery bank with an alternator powered by an engine; and contemporaneously charging a starter battery with a direct current (DC) to DC charger powered by the alternator.

Example 17: The method of example 16, further comprising: automatically disconnecting the starter battery from the alternator while the alternator is charging the at least one house battery bank.

Example 18: A storage mode battery switching device comprising a storage switch for placing the device in a storage mode, wherein the storage switch is configured to: disconnect loads from a house battery bank; connect the loads to a starter battery; and disable an engine starter solenoid by switching off a trigger wire for the engine starter solenoid.

Example 19: The storage mode battery switching device of Example 18, further comprising a running switch for placing the device in a running mode, wherein the running switch is configured to: disconnect the loads from the starter battery; reconnect the loads to the house battery bank; and enable the engine starter solenoid by switching on the trigger wire for the engine starter solenoid.

Example 20: The storage mode battery switching device of any one of Examples 18-19, wherein the loads include one or more house components.

Example 21: A method of charging at least one house battery bank, comprising: in response to detecting an ignition on signal and detecting a merge signal indicating an electrical connection between a house battery bank and at least one of a starter battery or an alternator: disconnecting the starter battery from the alternator.

Example 22: The method of Example 21, wherein disconnecting the starter battery from the alternator includes adjusting a disconnect signal to cause a disconnect solenoid to disconnect the starter battery from the alternator.

Example 23: The method of any one of Examples 21-22, further comprising: reconnecting the starter battery to the alternator in response to detecting at least one of the ignition on signal being removed, the merge signal being removed, or power being disconnected.

Example 24: The method of Example 23, wherein reconnecting the starter battery to the alternator includes adjusting a disconnect signal to cause a disconnect solenoid to reconnect the starter battery to the alternator.

Example 25: The method of any one of Examples 21-24, further comprising: in response to detecting the merge signal indicating an electrical connection between the house battery bank and at least one of the starter battery or the alternator: performing at least one of connecting the starter battery to a DC to DC charger or turning on the DC to DC charger.

Example 26: The method of Example 25, wherein connecting the starter battery to the DC to DC charger includes adjusting a coupling signal to cause a coupling solenoid to connect the starter battery to the DC to DC charger.

Example 27: The method of any one of Examples 25-26, further comprising: receiving the merge signal from a voltage monitor with a time delay relay; and delaying at least one of the connecting the starter battery to the DC to DC charger or the turning on the DC to DC charger.

Example 28: The method of any one of Examples 25-27, further comprising: performing at least one of disconnecting the starter battery from the DC to DC charger or turning off the DC to DC charger in response to detecting at least one of: the ignition on signal being removed, the merge signal being removed, power being disconnected, a line voltage being above a first voltage threshold or below a second voltage threshold, or an alternator voltage being above a first voltage threshold or below a second voltage threshold.

Example 29: The method of Example 28, wherein disconnecting the starter battery from the DC to DC charger includes adjusting a coupling signal to cause a coupling solenoid to disconnect the starter battery from the DC to DC charger.

Example 30: The method of any one of Examples 21-29, further comprising: reconnecting the starter battery to the alternator in response to detecting at least one of: a line voltage is above or below an expected voltage range; an alternator voltage is above or below an expected voltage range; a loss of the ignition on signal; or a loss of the merge signal.

Example 31: The method of Example 30, wherein reconnecting the starter battery to the alternator includes adjusting a disconnect signal to cause a disconnect solenoid to connect the starter battery to the alternator.

Example 32: The method of any one of Examples 21-31, further comprising: receiving the merge signal from a voltage monitor with a time delay relay; and delaying the disconnecting of the starter battery from the alternator.

The invention claimed is:

1. A system for charging a house battery bank in a vehicle, the system comprising:

a starter battery junction;

an alternator powered by an engine and configured to output power to the starter battery junction;

a merge solenoid electrically coupled to the starter battery junction and the house battery bank;

a DC to DC charger configured to receive power from the alternator via the starter battery junction;

a disconnect solenoid electrically coupled to a starter battery and the starter battery junction;

a voltage monitor electrically connected to the merge solenoid via a voltage sense wire; and a controller monitor;

wherein the voltage monitor is configured to:

in response to detecting a signal from an oil pressure switch and determining that a voltage sensed via the voltage sense wire is within a predetermined range, generate a merge signal to indicate an electrical connection between the house battery bank and at least one of the starter battery or the alternator, and transmit the generated merge signal to the controller monitor; and wherein the controller monitor is configured to:

in response to detecting an ignition on signal and the merge signal generated by the voltage monitor:

adjust a disconnect signal to cause the disconnect solenoid to disconnect the starter battery from the starter battery junction that is receiving power from the alternator; and adjust a remote On/Off signal generated by the controller monitor to turn the DC to DC charger on and thereby cause the DC to DC charger to provide power to the starter battery.

2. The system of claim 1, wherein the vehicle is a recreational vehicle (RV), a commercial motor vehicle (CMV), a boat, a yacht, an aircraft, a device having two or more battery banks of different chemistry, or a device having two or more battery banks having an incompatibility.

3. The system of claim 1, wherein the controller monitor is further configured to adjust the disconnect signal to cause the disconnect solenoid to reconnect the starter battery to the starter battery junction in response to at least one of the merge signal being removed or the ignition on signal being removed.

4. The system of claim 1, wherein the controller monitor further comprises:

a time delay relay configured to receive the merge signal from the voltage monitor and configured to delay the adjustment of the disconnect signal and the remote On/Off signal.

5. The system of claim 1, further comprising a coupling solenoid electrically coupled to the starter battery and the DC to DC charger;

wherein the controller monitor is further configured to:

in response to detecting the merge signal generated by the voltage monitor:

adjust a coupling signal to cause the coupling solenoid to connect the starter battery to the DC to DC charger.

6. The system of claim 5, wherein the controller monitor is further configured to:

adjust the coupling signal to cause the coupling solenoid to disconnect the DC to DC charger from the starter battery in response to at least one of the merge signal being removed or the ignition on signal being removed.

7. The system of claim 1, wherein the controller monitor is further configured to:

adjust the remote On/Off signal to turn the DC to DC charger off in response to the ignition on signal being removed.

8. The system of claim 5, wherein the controller monitor further comprises:

at least one time delay relay configured to receive the merge signal from the voltage monitor and configured to delay the adjustment of at least one of the coupling signal or the remote On/Off signal.

9. The system of claim 1, wherein the voltage monitor is further configured to monitor a line voltage, an alternator voltage, a voltage of the ignition on signal, a voltage of the signal from the oil pressure switch, and a voltage between the alternator and the house battery bank.

10. The system of claim 9, wherein the voltage monitor is further configured to:

stop generating and transmitting the merge signal to the controller monitor, thereby causing the controller monitor to adjust the disconnect signal to cause the disconnect solenoid to reconnect the starter battery to the starter battery junction and to adjust the remote On/Off signal to turn the DC to DC charger off in response to detecting at least one of the line voltage, the alternator voltage, the voltage of the ignition on signal, the voltage of the signal from the oil pressure switch, or the voltage between the alternator and the house battery bank is above or below an expected voltage range.

11. The system of claim 9, wherein monitoring the line voltage, the alternator voltage, the voltage of the ignition on signal, the voltage of the signal from the oil pressure switch, and the voltage between the alternator and the house battery bank comprises comparing each voltage to at least one of a first voltage threshold or a second voltage threshold.

12. The system of claim 10, wherein stopping the generating and transmitting the merge signal to the controller monitor further causes the controller monitor to:

adjust the coupling signal to cause the coupling solenoid to disconnect the DC to DC charger from the starter battery.

13. A method of charging a house battery bank, comprising:

charging at least one house battery bank using power received via a closed merge solenoid that connects the house battery bank to a starter battery junction, wherein the starter battery junction receives the power from an alternator powered by an engine; and contemporaneously charging a starter battery that is disconnected from receiving power from the alternator via the starter battery junction by an open disconnect solenoid, wherein charging the starter battery includes charging the starter battery using power received from a DC to DC charger that receives power generated by the alternator via the starter battery junction.

14. The method of claim 13, further comprising:

automatically disconnecting the starter battery from the alternator while the alternator is charging the at least one house battery bank.

15. A method of charging at least one house battery bank, comprising:

in response to detecting, by a voltage monitor, a signal from an oil pressure switch and determining that a voltage sensed from a merge solenoid via a voltage sense wire is within a predetermined range:

generating, by the voltage monitor, a merge signal to indicate an electrical connection between the at least one house battery bank and at least one of a starter battery and an alternator;

transmitting, by the voltage monitor, the merge signal to a controller monitor; and in response to detecting, by the controller monitor, an ignition on signal and the merge signal:

disconnecting, by the controller monitor, the starter battery from a starter battery junction that is receiving power from the alternator.

16. The method of claim 15, wherein disconnecting the starter battery from the starter battery junction includes adjusting a disconnect signal to cause a disconnect solenoid to disconnect the starter battery from the starter battery junction.

17. The method of claim 15, further comprising:

reconnecting the starter battery to the starter battery junction in response to the controller monitor detecting at least one of the ignition on signal being removed, the merge signal being removed, or power being disconnected.

18. The method of claim 17, wherein reconnecting the starter battery to the starter battery junction includes adjusting a disconnect signal to cause a disconnect solenoid to reconnect the starter battery to the starter battery junction.

19. The method of claim 15, further comprising:
in response to detecting, by the controller monitor, the ignition on signal and the merge signal:
performing, by the controller monitor, at least one of connecting the starter battery to a DC to DC charger or turning on the DC to DC charger.

20. The method of claim 19, wherein connecting the starter battery to the DC to DC charger includes adjusting a coupling signal to cause a coupling solenoid to connect the starter battery to the DC to DC charger.

21. The method of claim 19, further comprising:
receiving, by the controller monitor, the merge signal from the voltage monitor via a time delay relay; and
delaying, by the controller monitor, at least one of the connecting the starter battery to the DC to DC charger or the turning on the DC to DC charger using the time delay relay.

22. The method of claim 19, further comprising:
performing at least one of disconnecting the starter battery from the DC to DC charger or turning off the DC to DC charger in response to detecting at least one of:
the ignition on signal being removed,
the merge signal being removed,
power being disconnected,
a line voltage being above a first voltage threshold or below a second voltage threshold, or
an alternator voltage being above a first voltage threshold or below a second voltage threshold.

23. The method of claim 22, wherein disconnecting the starter battery from the DC to DC charger includes adjusting a coupling signal to cause a coupling solenoid to disconnect the starter battery from the DC to DC charger.

24. The method of claim 15, further comprising:
reconnecting the starter battery to the starter battery junction in response to detecting at least one of:
a line voltage is above or below an expected voltage range;
an alternator voltage is above or below an expected voltage range;
a loss of the ignition on signal; or
a loss of the merge signal.

25. The method of claim 24, wherein reconnecting the starter battery to the starter battery junction includes adjusting a disconnect signal to cause a disconnect solenoid to connect the starter battery to the starter battery junction.

26. The method of claim 15, further comprising:
receiving, by the controller monitor, the merge signal from the voltage monitor via a time delay relay; and
delaying, by the controller monitor, the disconnecting of the starter battery from the starter battery junction using the time delay relay.

* * * * *